(12) United States Patent
Koubuchi et al.

(10) Patent No.: US 7,199,432 B2
(45) Date of Patent: Apr. 3, 2007

(54) SEMICONDUCTOR INTEGRATED CIRCUIT DEVICE

(75) Inventors: Yasushi Koubuchi, Kokubunji (JP);
Koichi Nagasawa, Koganei (JP);
Masahiro Moniwa, Sayama (JP);
Youhei Yamada, Kodaira (JP);
Toshifumi Takeda, Tachikawa (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/926,142

(22) Filed: Aug. 26, 2004

(65) Prior Publication Data

US 2005/0026405 A1 Feb. 3, 2005

Related U.S. Application Data

(60) Division of application No. 10/619,039, filed on Jul. 14, 2003, which is a continuation of application No. 10/075,246, filed on Feb. 15, 2002, now Pat. No. 6,664,642, which is a continuation of application No. 09/846,260, filed on May 2, 2001, now Pat. No. 6,433,438, which is a division of application No. 09/050,416, filed on Mar. 31, 1998, now Pat. No. 6,261,883.

(30) Foreign Application Priority Data

May 31, 1997 (JP) .................................. 9-81013
Feb. 16, 1998 (JP) .................................. 10-33388

(51) Int. Cl.
*H01L 29/76* (2006.01)
(52) U.S. Cl. ...................... 257/374; 438/400

(58) Field of Classification Search ................ 257/374; 438/400
See application file for complete search history.

(56) References Cited

U.S. PATENT DOCUMENTS

| 4,916,087 A | | 4/1990 | Tateoka et al. |
| 5,010,039 A | * | 4/1991 | Ku et al. ..................... 438/702 |
| 5,292,689 A | | 3/1994 | Cronin |
| 5,321,304 A | | 6/1994 | Rostoker |

(Continued)

FOREIGN PATENT DOCUMENTS

JP 55-135837 10/1980

(Continued)

OTHER PUBLICATIONS

Lee et al "An Optimized Densification of the Filled Oxide For Quarter Micron Shallow Trench Isolation (STI)", 1996, Symposium on VLSI Technology Digest Of Technical Papers, pp. 158-159.

(Continued)

*Primary Examiner*—Long Pham
(74) *Attorney, Agent, or Firm*—Antonelli, Terry, Stout and Kraus, LLP.

(57) ABSTRACT

Interconnections are formed over an interlayer insulating film which covers MISFETQ1 formed on the principal surface of a semiconductor substrate, while dummy interconnections are disposed in a region spaced from such interconnections. Dummy interconnections are disposed also in a scribing area. Dummy interconnections are not formed at the peripheries of a bonding pad and a marker. In addition, a gate electrode of a MISFET and a dummy gate interconnection formed of the same layer are disposed. Furthermore, dummy regions are disposed in a shallow trench element-isolation region. After such dummy members are disposed, an insulating film is planarized by the CMP method.

44 Claims, 27 Drawing Sheets

U.S. PATENT DOCUMENTS

| | | |
|---|---|---|
| 5,323,049 A | 6/1994 | Motonami |
| 5,361,234 A | 11/1994 | Iwasa et al. |
| 5,441,915 A | 8/1995 | Lee |
| 5,441,916 A | 8/1995 | Motonami |
| 5,442,236 A | 8/1995 | Fukazawa |
| 5,459,093 A | 10/1995 | Kuroda |
| 5,498,565 A | 3/1996 | Gocho et al. |
| 5,614,445 A * | 3/1997 | Hirabayashi ............... 438/430 |
| 5,621,241 A | 4/1997 | Jain |
| 5,885,856 A | 3/1999 | Gilbert |
| 5,892,277 A | 4/1999 | Ikemizu |
| 5,929,528 A | 7/1999 | Kinugawa |
| 6,077,784 A | 6/2000 | Wu |
| 6,087,733 A | 7/2000 | Maxim |
| 6,130,139 A | 10/2000 | Ukeda |
| 6,171,976 B1 | 1/2001 | Cheng |
| 6,261,883 B1 | 7/2001 | Koubuchi |
| 6,346,736 B1 | 2/2002 | Ukeda |
| 6,433,438 B2 | 8/2002 | Koubuchi |
| 6,664,642 B2 | 12/2003 | Koubuchi |
| 2002/0058411 A1* | 5/2002 | Hasegawa et al. .......... 438/653 |

FOREIGN PATENT DOCUMENTS

| | | |
|---|---|---|
| JP | 01-149435 | 6/1989 |
| JP | 02-138757 | 5/1990 |
| JP | 2-504575 | 12/1990 |
| JP | 03-038043 | 2/1991 |
| JP | 03-071630-0 | 7/1991 |
| JP | 05-267460 | 10/1993 |
| JP | 05-275527 | 10/1993 |
| JP | 5275527 | 10/1993 |
| JP | 06-069201 | 3/1994 |
| JP | 6-125013 | 5/1994 |
| JP | 06-151768 | 5/1994 |
| JP | 06-216332 | 8/1994 |
| JP | 06-326106 | 11/1994 |
| JP | 774175 | 3/1995 |
| JP | 923844 | 3/1995 |
| JP | 07092838 | 4/1995 |
| JP | 08-288295 | 11/1996 |
| JP | 8314762 | 11/1996 |
| JP | 09-55421 | 2/1997 |
| JP | 09-181159 | 7/1997 |
| JP | 9181159 | 7/1997 |
| JP | 2802455 | 7/1998 |
| KR | 1994-0009350 | 10/1994 |
| KR | 1996-0000962 | 5/1996 |
| KR | 1997-011056 | 7/1997 |
| KR | 1996-0043102 | 12/1998 |
| WO | WO 90/03046 | 3/1990 |
| WO | 9615552 | 5/1996 |
| WO | WO 96/15552 | 5/1996 |

OTHER PUBLICATIONS

Office Action of Korean Application No. 10-1998-0010428 dated Jan. 31, 2005 with English language translation.

* cited by examiner

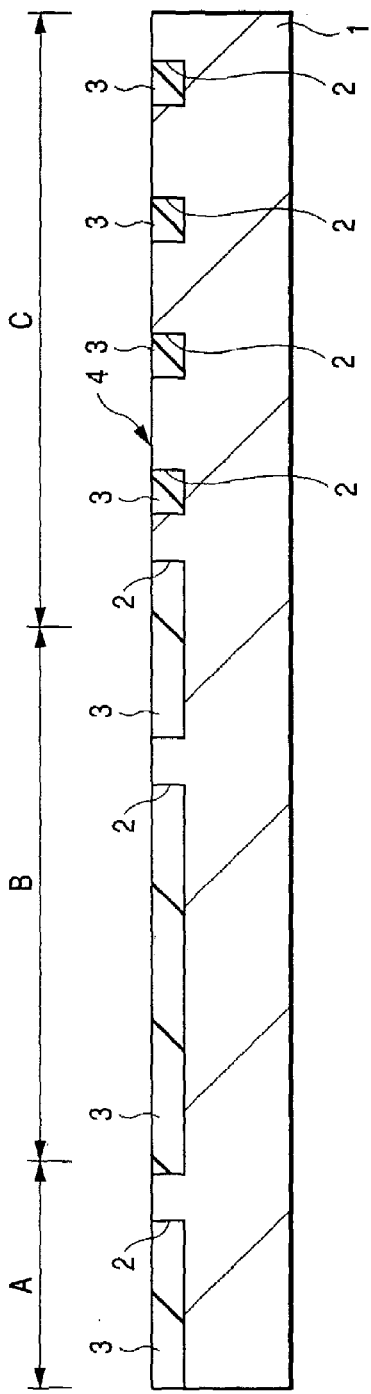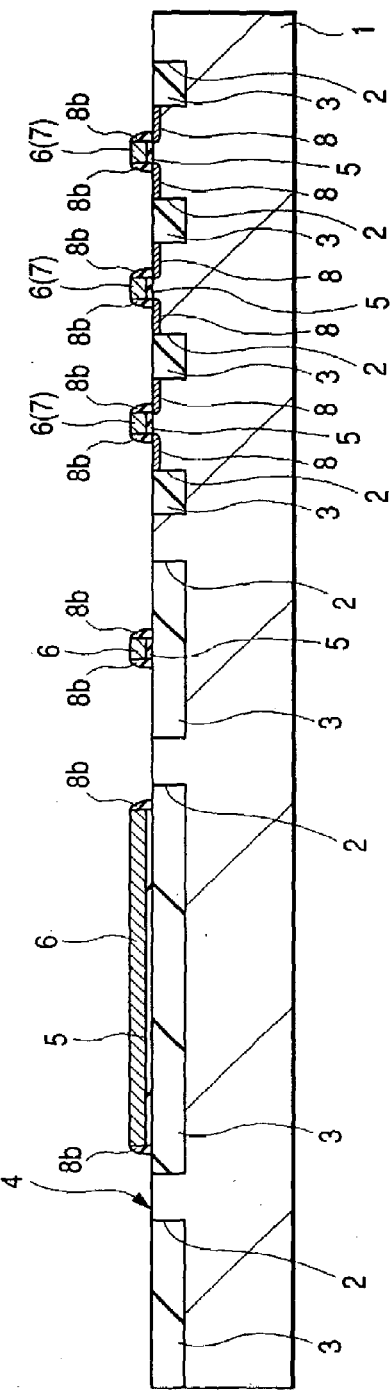

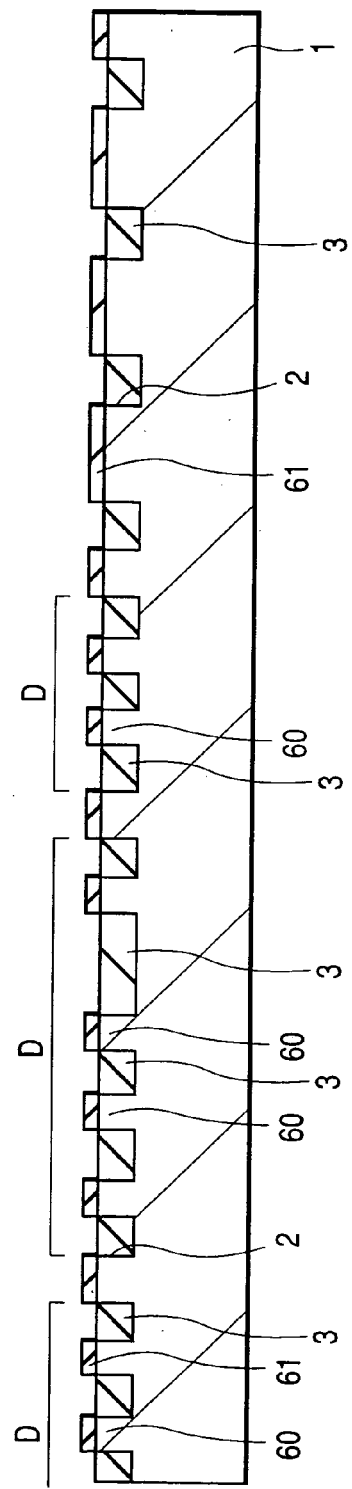
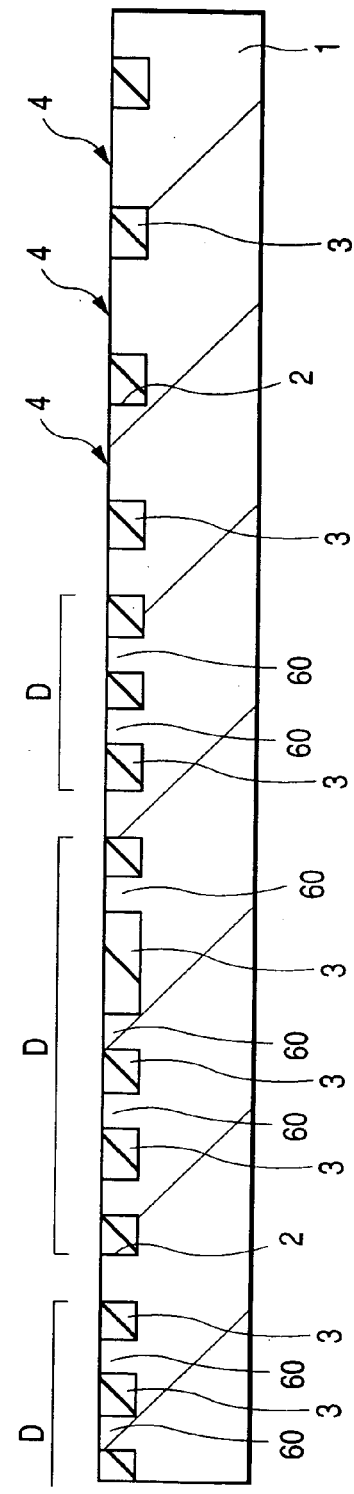

SEMICONDUCTOR INTEGRATED CIRCUIT DEVICE

CROSS REFERENCE TO RELATED APPLICATION

This application is a Divisional application of U.S. Ser. No. 10/619,039, filed Jul. 14, 2003, which is a Continuation of Ser. No. 10/075,246 filed Feb. 15, 2002, now U.S. Pat. No. 6,664,642, which is a Continuation of Ser. No. 09/846,260, filed May 2, 2001, now U.S. Pat. No. 6,433,438, which is a Divisional application of Ser. No. 09/050,416, filed Mar. 31, 1998, now U.S. Pat. No. 6,261,883.

BACKGROUND OF THE INVENTION

This invention relates to a semiconductor integrated circuit device and to a fabrication process thereof, and more particularly, the invention relates to a technique which is effective when applied to a semiconductor integrated circuit device, which is fabricated by a process including a planarization step using the CMP (Chemical Mechanical Polishing) method.

To satisfy the continuing tendency to decrease the minimum processing size of a semiconductor integrated circuit device, in an exposure optical system, an increase in the performance of a stepper is required, which promotes a widening of the aperture size of a lens and a shortening of the exposure wave length. As a result, the focus depth of the exposure optical system decreases and even a slight unevenness on the surface to be processed becomes a problem. Therefore, the accurate planarization of the surface to be processed becomes an important technical objective for the device process. Furthermore, the above planarization does not aim at the easing of a stepped portion for the purpose of preventing a short cut of interconnections formed on the stepped portion, but is directed to a global planarization, in other words, a complete planarization.

As a surface planarization technique, there are a method of coating an SOG (Spin On Glass) film or a low-melting-point glass by melting it, a method of heat treatment through glass flow, a self planarization method adopting a surface reaction mechanism of CVD (Chemical Vapor Deposition) and the like. Owing to the surface conditions, to the heat treatment conditions being applied or to limitations in processing, in many cases, it is impossible to carry out complete planarization, that is, global planarization, using these methods. Therefore, the etchback and CMP processes are regarded as promising practical techniques which permit complete planarization.

As for the etchback process, the use of a photoresist as a sacrificial film, the use of an SOG film and the use of a self-planarization CVD film are known, but they are accompanied by such drawbacks as a complex procedure, a high cost and a lowering of the yield due to production of particles. The CMP process has, on the other hand, come to be regarded as an excellent process from an overall viewpoint, because, compared with the etchback process, it is more free from the above-described problems. Consequently, the CMP process is considered to be most promising as a practical technique for effecting complete planarization.

The CMP technique is described in, for example, Japanese Patent Application Laid-Open No. HEI 7-74175, U.S. Pat. No. 5,292,689 and "1996 Symposium on VLSI Technology Digest of Technical Papers, 158–159(1996)".

SUMMARY OF THE INVENTION

During the investigation of a technique for the complete planarization of a device surface to which the CMP method is applied, which technique is not, however, a known process, the present inventors have recognized that there are the following drawbacks.

FIGS. 29(a) to 29(d) are each a cross-sectional view illustrating a planarization technique using the CMP method which the present inventors have investigated. For covering an interconnection with an insulating film and then planarizing the insulating film, an interconnection 102 is formed on an interlayer insulating film 101 (FIG. 29(a)); a first insulating film 103 and a second insulating film 104, such as SOG, are deposited to embed a concave portion thereof by the plasma CVD method or the like using TEOS (Tetraethoxysilane: $(C_2H_5O)_4Si$) (FIG. 29(b)); a third insulating film 105 is deposited by the plasma CVD method using TEOS (FIG. 29(c)); and then the third insulating film 105 is polished by the CMP method for effecting planarization (FIG. 29(d)).

At the present time, in the designing of a layout based on principles of functional design and logic design, the most important consideration concerning the pattern of the interconnection 102 has been based on whether the pattern follows the ordinary layout rule or not, and polishing properties in the CMP step have not been taken into particular consideration.

The interconnection pattern is therefore not uniform, being sparse in some places and dense in some places. In the drawing illustrating the technique under investigation (FIG. 29(d)), it is seen that the interconnections 102 are dense in the portion A, while they are sparse in the other region. When CMP polishing is conducted under such a state, that is, a state where interconnections 102 are not disposed uniformly, being sparse in some places and dense in some places, the surface of the third insulating film 105 cannot be planarized completely. In a region where the interconnections 102 are dense, there appears a difference of 0.2 to 0.3 μm in height in the region A and a large undulation inevitably remains on the surface.

On the surface having such an undulation, the processing margin lowers in the subsequent photolithography step or etching step, and it becomes difficult to satisfy minute processing and heightening requirements of integration, which makes it impossible to bring about an improvement in the reliability of the semiconductor integrated circuit device and also an improvement in the yield. In addition, the existence of an undulation requires the optimization of the process conditions in order to carry out lithography and etching favorably in such a state, and an optimization of the CMP step also becomes necessary to suppress the undulation to a minimum. The time required for such optimization sometimes undesirably delays the starting time of the mass-production process.

In the region where the interconnections 102 are disposed sparsely, the recess between the interconnections 102 is not embedded sufficiently with the second insulating film 104, and so the third insulating film 105 must be thicker in order to fill in such a recess completely, which consequently causes problems, such as an increase in the polishing amount of the third insulating film 105 and a rise in the step load in the CMP step, as well as an increase in the step load, such as a long deposition time, of the third insulating film 105.

An object of the present invention is to completely planarize the surface of a member which has been polished by the CMP method.

Another object of the present invention is to provide a technique which can improve the processing margin in the photolithography and etching steps, thereby to achieve minute processing and an increased integration, while, at the same time, improving the reliability and yield of the semiconductor integrated circuit device.

A further object of the present invention is to facilitate the start of the process.

A still further object of the present invention is to reduce the amount of polishing of a member to be polished by the CMP method and to decrease the load and time of the polishing step, thereby improving the cost competitive advantage.

A still further object of the present invention is to provide a method of designing a member pattern which can be planarized completely by the CMP method.

A still further object of the present invention is to suppress an increase in the parasitic capacitance of an interconnection or the like which is caused by the measures to achieve complete planarization, thereby maintaining the performance of the semiconductor integrated circuit device.

The above-described and other objects, and novel features of the present invention will be more apparent from the following description and accompanying drawings.

Typical features of the invention disclosed by the present application will be described briefly.

(1) The semiconductor integrated circuit device according to the present invention comprises actual interconnections which are formed on a principal surface of a semiconductor substrate or an interlayer insulating film constituting a semiconductor integrated circuit element, and an insulating film containing a film which covers the actual interconnections and has been planarized by the CMP method; wherein dummy interconnections, formed of the same material as that of the actual interconnections, but not functioning as an element, are formed in an empty space between adjacent, spaced interconnections in the interconnection layer where said actual interconnections are formed.

In addition, the semiconductor integrated circuit device according to the present invention comprises a shallow trench formed on the principal surface of a semiconductor substrate, an element isolation region having an insulating film, which contains a film planarized by the CMP method, embedded in the shallow trench, and active regions of the semiconductor integrated circuit element separated by said element isolation region, wherein dummy regions, which do not function as a semiconductor integrated circuit element, are formed on the principle surface of the semiconductor substrate in an empty space of the semiconductor substrate between said spaced active regions.

By providing such a semiconductor integrated circuit device with dummy interconnections or dummy regions formed in an empty space to prevent the formation of a sparse portion, the surface of the insulating film which covers the interconnections or the principal surface of the semiconductor substrate can therefore be planarized completely.

Described more specifically, in the case where only actual interconnections or active regions (element constituting members) are formed without dummy interconnections or dummy regions (dummy members), an empty space appears between adjacent but spaced element constituting members. If an insulating film is deposited without eliminating such an empty region, the surface of the insulating film near the empty region becomes uneven reflecting the shape of each of the element constituting members precisely. Such an uneven shape becomes a factor for inhibiting complete planarization, as illustrated in FIG. 29(d).

In accordance with the present invention, therefore, dummy members are disposed in such an empty region to ease the uneven shape of the insulating film, whereby the surface of the insulating film is planarized completely after polishing by the CMP method. The surface of the insulating film is planarized completely in this manner so that the process margin in the subsequent lithography step or etching step can be increased. As a result, the production yield of the semiconductor integrated circuit device can be improved and the starting time for the process can be shortened.

Incidentally, examples of the interconnection include a metal interconnection formed on an interlayer insulating film, a gate interconnection of a MISFET (Metal-Insulator-Semiconductor Field Effect Transistor) and a bit line of a DRAM (Dynamic Random Access Memory). It is needless to say that not only the interconnection of memory devices, such as a DRAM, but also the interconnection of logic devices, are included in the metal interconnection and gate interconnection. In particular, the logic device generally has a multilayer interconnection formed of at least three layers so that the application of the present invention to such an interconnection brings about marked effects.

(2) In another aspect, the semiconductor integrated circuit device according to the present invention contains a high-density member region which satisfies the conditions that the distance between adjacent members of the dummy interconnections and the actual interconnections, or between adjacent members of dummy regions and active regions, is set to at least the minimum space width which is required by the resolution power of lithography, and that said distance is set to at least twice the height of the interconnection or the depth of the shallow trench; and the area of the high-density member region is at least 95% of the whole chip area.

By setting the distance between the adjacent members of the dummy interconnections and the actual interconnections or between the adjacent members of the dummy regions and active regions at not greater than twice the height of the interconnections or depth of the shallow trench, there is no pattern dependence of the member pattern on the CMP polishing rate of the insulating film formed over such members, and the CMP polishing rate becomes uniform, which makes it possible to attain substantially complete surface flatness of the insulating film.

FIG. 30 shows data indicating the finding of the present inventors obtained as a result of test and investigation and it graphically represents the fluctuation of a CMP polishing amount relative to the distance between dummy patterns. The distance between dummy patterns standardized by the height of the pattern is plotted along the abscissa, while the CMP polishing amount of the insulating film on the pattern relative to the standard pattern (solid pattern) is plotted along the ordinate. As is apparent from FIG. 30, the CMP polishing amount of the insulating film does not show a change even it the distance between the dummy patterns becomes approximately twice the height of the pattern. In other words, if the distance between the adjacent members of the dummy interconnections and the actual interconnections, or between the adjacent members of the dummy regions and active regions, is set at not greater than twice the height of the interconnection or the depth of the shallow bench, the CMP rate of the insulating film formed over such members becomes fixed irrespective of the pattern and the insulating film can be planarized completely.

In order to attain planarization over the whole chip, the region where complete planarization can be materialized, that is, the high-density member region preferably is as wide as possible, but it is not necessary for the whole area of the chip to be a high-density member region. A sufficiently flat surface suited for practical use can be obtained so long as the high-density member region permitting complete planarization occupies at least 95% of the chip area.

Another condition that the distance between these members is set at not less than the minimum space width required by the resolution power of lithography is established because a processing space exceeding the minimum processing size is necessary for favorable member processing. It is possible to carry out processing of the interconnections or dummy interconnections, or the active regions or dummy regions, by satisfying the above condition. Incidentally, when a KrF exima laser is used as an exposure source, 0.2 µm can be given as an example of the minimum space width.

Incidentally, in the remaining 5% region which is not a high-density member region, it is preferred that the distance between adjacent members of dummy interconnections and actual interconnections, or between adjacent members of the dummy regions and active regions, is set at not greater than four times the height of the interconnection or the depth of the shallow trench. The polishing amount of the insulating film in such a region where. the pattern distance is set at not greater than four times the height of the interconnection or the depth of the shallow trench, that is, a low-density member region shows fluctuations about twice as much as that of the high-density member region, as is illustrated in FIG. 30. Because the area of the low-density member region is not larger than 5% of the chip area, however, the influence of the fluctuation can be neglected.

In addition, in the semiconductor integrated circuit device according to the present invention, the dummy interconnections or dummy regions each have a width not smaller than the minimum line width which is required by the resolution power of lithography, or has a length not smaller than twice the minimum line width; and at the same time, in the scribing area, the width and length of each of the dummy interconnections or dummy regions is not larger than the distance between bonding pads. Incidentally, the minimum space width and minimum line width can each be set at 0.2 µm and the distance between bonding pads can be set at 10 µm.

According to such a semiconductor integrated circuit device, by setting the width of each of the dummy interconnections or dummy regions at not smaller then the minimum line width, which is required by the resolution power of lithography, the dummy interconnections or dummy regions can be processed with precision; and by setting the length of each of the dummy interconnections or dummy regions at not less than twice the minimum line width, the resolution of such members can be maintained with certainty. In other words, there is a potential problem that a pattern having the minimum processing size in width and length cannot be resolved accurately, but such a potential problem can be avoided in the case of the present invention by setting the length of each of the dummy interconnections or dummy regions at not less than twice the minimum processing size. The width or length of each of the dummy interconnections or dummy regions is set at 30 µm or less, with 20 um or less being frequently used and with 10 µm or less being preferred.

In addition, by setting each of the width and length of the dummy interconnections or dummy regions at not greater than 30 µm, a parasitic capacitance of the interconnection and the like and also failure due to short circuits between the bonding pads can be reduced. Described specifically, an increase in the width or length of each of the dummy interconnections or dummy regions inevitably enlarges such dummy members, which increases the parasitic capacitance of the interconnection or the like functioning as a semiconductor integrated circuit element and impairs the performance of the semiconductor integrated circuit device, such as the high-speed responsiveness thereof. If the width or length is not greater than 30 µm, on the other hand, it is possible to suppress the parasitic capacitance of the interconnection or the like to an extent not causing a problem in practical use. When the dummy interconnections are disposed in a scribing area, there is a possibility that the scribed chips may become conductive dust. Even if they unfortunately become conductive dust, they cause a short-circuit only between bonding pads. So, by setting the width and length of each of the dummy interconnections at not greater than the distance between the bonding pads, the scribed chips do not cause a short circuit even if they become conductive dust. Owing to these advantages, deterioration in the performance and yield of the semiconductor integrated circuit device can be prevented.

In addition, in the semiconductor integrated circuit device according to the present invention, the dummy interconnections or dummy regions are formed also in the scribing area. According to such a semiconductor integrated circuit device, complete planarization can be maintained even in the scribing area, whereby complete planarization all over the wafer can be actualized.

In addition, in the semiconductor integrated circuit device according to the present invention, a pattern density of interconnections formed of the dummy interconnections and actual interconnections, or a pattern density of regions formed of the dummy regions and active regions, is made substantially uniform all over the regions on the semiconductor substrate.

Even by the semiconductor integrated circuit device as described above, complete planarization of the insulating film on these patterns can be actualized. Described more specifically, as indicated above, the existence of unevenness in the pattern density inhibits the flatness of the insulating film on the pattern. The evenness of the insulating film is therefore improved also by disposing dummy members so as not to cause unevenness in the pattern density.

(3) In a further aspect, the semiconductor integrated circuit device according to the present invention is similar to the above-described one except that, in the same interconnection layer which includes a bonding pad portion or marker portion for photolithography disposed on the semiconductor substrate, dummy interconnections are not formed at the periphery of the bonding pad portion or a marker portion.

Such a semiconductor integrated circuit device makes it possible to smoothly perform automatic detection of a bonding pad upon wire bonding and also automatic detection of a marker used for mask alignment during photolithography. Described more specifically, if dummy members made of the same material as that of the bonding pad or marker have been formed at the periphery thereof, there is a possibility that the dummy members will disturb, in the manner of a noise, the smooth detection of the bonding pad or marker. The present invention is free from such a possibility. Incidentally, it is possible that the dummy interconnections are not formed in a region 20 µm from the bonding pad portion or 60 µm from the marker portion.

In addition, the semiconductor integrated circuit device according to the present invention may contain, as the insulating film, a silicon oxide film formed by the SOG or high-density plasma CVD method, a BPSG (Boron-doped Phospho-Silicate Glass) or PSG (Phospho-Silicate Glass) film formed by the reflow method or a polysilazane film. According to such a semiconductor integrated circuit device, since the silicon oxide film formed by the SOG or high-density plasma CVD method, the BPSG or PSG film formed by the reflow method or the polysilazane film is excellent in step covering properties and has properties of embedding a concave portion therewith, a concave portion formed by adjacent members of the interconnections and dummy interconnections or of the active regions and dummy regions is filled in favorably with such a film, whereby the thickness of the insulating film to be polished by the CMP method can be decreased. Such a decrease in the thickness of the film to be polished by the CMP method leads to not only a reduction in the load of the deposition step of the film to be polished by the CMP method, but also a reduction in the load of the CMP step, which in turn brings about an improvement in the cost competitive advantage of the semiconductor integrated circuit device, for example, by reducing the process time.

The process for the fabrication of a semiconductor integrated circuit device according to the present invention is a process for the fabrication of the above-described semiconductor integrated circuit device, which comprises (a) depositing a conductive film containing polycrystalline silicon or a metal over the principal surface of a semiconductor substrate or over an interlayer insulating film and patterning said conductive film to form actual interconnections and dummy connections, (b) depositing a first insulating film, which is composed of a silicon oxide film formed by the SOG method or high-density plasma CVD method, a BPSG or PSG film formed by the re-flow method or a polysilazane film, over the actual interconnections and dummy interconnections including inner surfaces of concave portions formed by the actual interconnections and dummy interconnections and filling the concave portions with said film, (c) depositing a second insulating film over said first insulating film and (d) polishing the surface of said second insulating film by the CMP method; and wherein the second insulating film is formed to have a thickness sufficient for planarizing the unevenness on the surface of the first insulating film.

According to such a fabrication process of a semiconductor integrated circuit device, the second insulating film can be deposited to give a smaller film thickness, whereby the deposition time of the second insulating film can be shortened; and at the same time, the polishing amount of the second insulating film in the CMP polishing step can be reduced. As a result, in spite of the fact that the above process comprises conventional steps, the step time can be shortened and the step load can be reduced, which brings about an improvement in the cost competitive advantage in a semiconductor integrated circuit device.

Described more specifically, in the fabrication process according to the present invention, the concave portions formed between the actual interconnections and dummy interconnections are filled in with the first insulating film composed of a silicon oxide film formed by the SOC or high-density plasma CVD method, a BPSG or PSG film formed by the re-flow method or a polysilazane film, whereby the unevenness remaining on the surface of the second insulating film is lessened compared with the unevenness before the formation of the film. Accordingly, the thickness of the second insulating film must be sufficient for the planarization of the unevenness on the surface of the first insulating film, but the surface of the second insulating film can be planarized sufficiently even by a thin film.

(4) Incidentally, a rigid pad can be used for said CMP polishing. Alternatively, polishing by the CMP method can be employed only for the surface finish polishing after the unevenness on the surface attributable to the existence of the actual interconnections and dummy interconnections is substantially planarized by the first and second insulating films. As a polishing means employed for the surface finish, not only the CMP method, but also other polishing means, such as dry belt polishing and lapping, may be used.

The process for the fabrication of a semiconductor integrated circuit device according to the present invention is a process for the fabrication of the above-described semiconductor integrated circuit device, which comprises (a) depositing a silicon nitride film on the principal surface of a semiconductor substrate and patterning a portion of the silicon nitride film and semiconductor substrate in regions except for the active regions and dummy regions to form a shallow trench, (b) depositing an insulating film composed of a silicon oxide film on the semiconductor substrate, interconnections and silicon nitride film including the inner surface of the shallow trench, thereby filling in the trench with the insulating film, and (c) polishing the insulating film by the CMP method to expose the silicon nitride film.

According to the above-described fabrication process of a semiconductor integrated circuit device, dummy regions are formed also in an element isolation region so that dishing, that is, the formation of a recess, in the element isolation region can be prevented and the surface of the semiconductor substrate can be planarized completely. In addition, since the silicon nitride film having a lower CMP polishing rate than the silicon oxide film is formed between the insulating film, which is a film to be polished by the CMP method, and the active region of the semiconductor substrate, the silicon nitride film serves as a stopper layer for the CMP polishing and more complete flatness can be attained.

Incidentally, the above process may further comprise a step of using an alkaline slurry, which contains a silicon oxide as an abrasive, as the slurry used for the CMP method in the step (c) and subsequent to the step (c), etching of the insulating film formed in the shallow trench is performed through wet etching or dry etching to make the surface of the insulating film equal to or lower then the principal surface of the semiconductor substrate. When the alkaline slurry containing a silicon oxide as an abrasive is used, the ratio of the polishing rate of the silicon oxide film to the silicon nitride film becomes 3 or 4:1 so that it is necessary to thicken the silicon nitride film. In such a case, when the height of the principal surface of the semiconductor substrate, that is, the active region, and the height of the silicon oxide film, which is an element isolation region after the removal of the silicon nitride film, are compared, the silicon oxide film is found to be higher. The silicon oxide film is therefore etched by wet etching or dry etching to make the surface of the insulating film equal to or lower than the principal surface of the semiconductor substrate, whereby minute gate processing can be carried out.

Alternatively, a slurry containing cerium oxide as an abrasive can be used as the slurry in the CMP method in the step (c). In this case, the ratio of the polishing rate of the silicon oxide film to the silicon nitride film becomes 30 to 50:1 so that it is not necessary to thicken the silicon nitride film. The thickness of the silicon nitride film can be set to a value which is negligible in the process, for example, not greater than 50 nm so that the etching of the silicon oxide film subsequent to the removal of the silicon nitride film is not required.

(5) The method of designing a semiconductor integrated circuit device according to the present invention comprises forming a mask pattern for a mask used for the processing of members each constituting a semiconductor integrated circuit element, wherein said mask pattern includes a member pattern for members and a dummy pattern which is not disposed in a dummy placement prohibited region; and a mask pattern is formed so as to satisfy all of the following conditions: a first condition wherein a pattern distance between adjacent patterns of the member patterns and dummy patterns is not less than the minimum space width which is required by the resolution power of lithography, or not less than 0.2 μm; a second condition wherein the pattern distance is not greater then twice the height of the member in a region of at least 95% of the chip area, and in a region of at most 5% of the chip area, the pattern distance is not greater than four times the height of the member; a third condition wherein the width of the dummy pattern is at least the minimum line width which is required by the resolution power of lithography, or at least 0.2 μm; a fourth condition wherein the width of the dummy pattern is not greater than the distance between bonding pads disposed in the semiconductor integrated circuit device or not greater than 10 μm; a fifth condition wherein the length of the dummy pattern is not less than twice the minimum line width or not less than 0.2 μm; and a sixth condition wherein the length of the dummy pattern is not greater than the distance between the bonding pads or not less than 10 μm.

Such a method of designing a semiconductor integrated circuit device makes it possible to design a mask for member patterns necessary for the fabrication of said semiconductor integrated circuit device. By the above-described conditions, the advantages of the above-described semiconductor integrated circuit device can be actualized.

Incidentally, it is needless to say that the dummy pasterns can be disposed also in a scribing area of the semiconductor substrate. The dummy placement prohibited -region can be set within a range of 20 μm from an end portion of the pattern to be a bonding pad, a range of 60 μm from an end portion of the pattern to be a marker for photolithography, a range of 0.5 μm from a region in which a contact hole is to be formed, or a fuse region. By setting the dummy placement prohibited region as described above, it becomes easier to detect the bonding pad or the marker for the mask alignment upon wire bonding or photolithography, which makes it possible to form a contact hole between the interconnections of different layers or a contact hole between the interconnection and the semiconductor substrate.

In the case of a metal interconnection wherein the member and the storage capacitative element which is to be formed above a bit line are formed in substantially the same layer, the dummy placement can be prohibited in a region which is to have a storage capacitative element thereon. In such a case, the first metal interconnection layer and the storage capacitative element of a DRAM can be formed in the same layer and dummy interconnections can be disposed in a region of the first metal interconnection layer.

In the case of the active region wherein members are formed on the principal surface of the semiconductor substrate, the placement of dummy regions can be prohibited in a region wherein a gate interconnection is formed on the principal surface of the semiconductor substrate. In such a case, since no dummy region is formed belong the gate interconnection, the capacitance between the gate interconnection and the semiconductor substrate can be reduced. Described more specifically, because the dummy regions on the principal surface of the semiconductor substrate and the active region of the semiconductor substrate apparently have the same structure, the formation of the gate interconnection on the dummy regions increases the capacitance of the gate interconnection. The dummy regions are therefore not formed below the gate interconnection, which brings about an improvement in the performance of the semiconductor integrated circuit device, such as the high-peed responsiveness thereof.

In addition, the method of designing a semiconductor integrated circuit device according to the present invention comprises disposing dummy patterns so as to minimize the floating capacitance of a member which will otherwise be increased by the dummy members formed by the dummy patterns, whereby the performance of the semiconductor integrated circuit device, such as the high-speed responsiveness thereof, can be improved. Incidentally, such disposal of elements can be effected by satisfying the above-described conditions for the method of designing a semiconductor integrated circuit device and then, optimizing the dummy patterns so as to minimize the area and the number of the dummy patterns. Such optimization can be calculated automatically by an information processor such as computer which forms a layout pattern.

BRIEF DESCRIPTION OF THE DRAWINGS

FIG. 5 is a cross-sectional view illustrating one example of the fabrication process of the logic integrated circuit device according to Embodiment 1 in the order of the steps;

FIG. 6 is a cross-sectional view illustrating one example of the fabrication process of the logic integrated circuit device according to Embodiment 1 in the order of the steps;

FIG. 27 is a cross-sectional view illustrating one example of the semiconductor integrated circuit device according to Embodiment 4 in the order of the steps;

FIG. 28 is a cross-sectional view illustrating one example of the semiconductor integrated circuit-device according to Embodiment 4 in the order of the steps;

EMBODIMENTS OF THE PRESENT INVENTION

Figure 1:
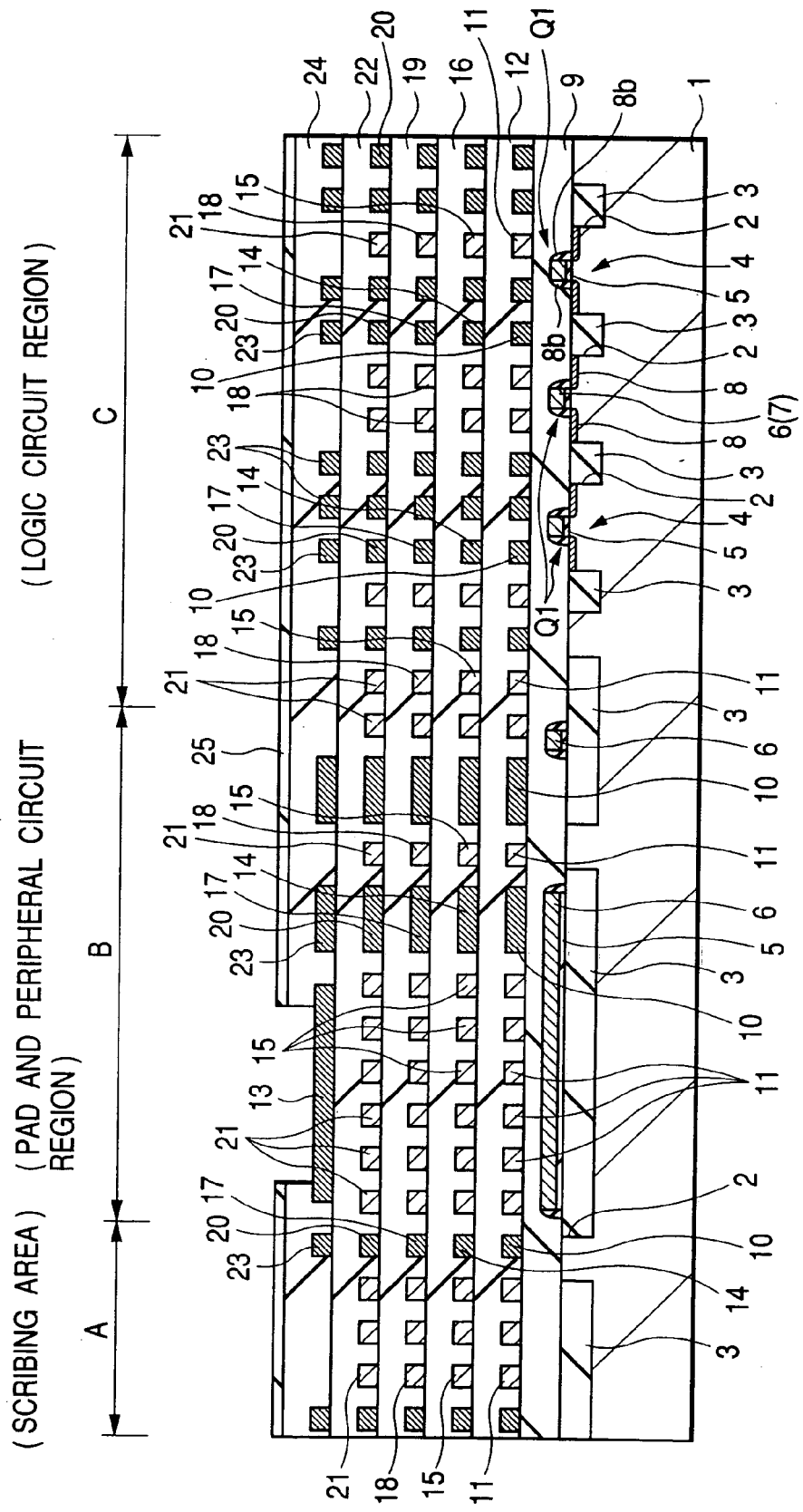
FIG. 1 is a cross-sectional view illustrating one example of a logic integrated circuit device according to Embodiment 1 of the semiconductor integrated circuit device of the present invention.

The embodiments of the present invention will next be described in detail with reference to accompanying drawings. Incidentally, in each of the drawings illustrating the following embodiments, like elements will be identified by like reference numerals and overlapping descriptions will be omitted.

(Embodiment 1)

FIG. 1 is a cross-sectional view illustrating one example of a logic integrated circuit device according to Embodiment 1 of the semiconductor integrated circuit device of the present invention. In FIG. 1, a scribing area A, a pad and peripheral circuit region B and a logic circuit region C of the semiconductor integrated circuit device are illustrated.

In the logic integrated circuit device according to Embodiment 1, a shallow trench 2 is formed on the principal surface of the semiconductor substrate 1, and in the shallow trench 2 a silicon oxide film, which is an insulating film, is embedded, whereby an element isolation region 3 is formed. By this element isolation region 3, an active region 4 formed on the principal surface of the semiconductor substrate 1 is defined. Incidentally, as an element isolation structure, a shallow trench is exemplified here, but a field insulating film formed by the LOCOS (Local Oxidation of Silicon) method may be employed as well. Although not illustrated here, P-type and N-type well regions may be formed on the principal surface of the semiconductor substrate.

In the active region 4, a MISFET is formed. On the principal surface of—the semiconductor substrate, a gate interconnection 6 is formed via a gate insulating film 5 of the MISFET. The gate insulating film 5 maybe, for example, a silicon oxide film formed by thermal oxidation, while the gate interconnection 6 may be, for example, a polycrystalline silicon film formed by the CVD method. On the surface of the polycrystalline silicon film, a silicide film is formed in order to reduce the—electrical resistance.

A portion of the gate interconnection 6 is formed to extend over the element separation region 3 and another portion is formed to be a gate electrode 7 of a MISFETQ1 formed in the active region 4 of the semiconductor substrate 1. On both sides of the gate electrode 7 in the active regions 4 on the principal surface of the semiconductor substrate 1, impurity semiconductor regions 8 are formed. The impurity semiconductor regions 8 function as a source drain region for the MISFETQ1. It is also possible to employ the region 8 as a so-called LDD (Lightly Doped Drain). On the side of the gate interconnection 6, a side wall spacer 8b is formed. The side wall spacer 8b can be formed of a silicon oxide film or a silicon nitride film.

The MISFETQ1 formed in the logic circuit region C functions as an active device for the logic circuit. Although not illustrated in FIG. 1, the MISFET formed in the pad and peripheral circuit region B functions as an active device for the peripheral circuit. Incidentally, the MISFET is exemplified as a transistor formed in the logic circuit region C and pad and peripheral circuit region B, but a bipolar transistor or Bi-CMOS transistor can also be employed.

The gate interconnection 6 is covered with an interlayer insulating film 9, over which interconnections 10 and dummy interconnections 11 are formed in the first interconnection layer. The interlayer insulating film 9 can be formed, for example, of a PSG film, BPSG film or a silicon oxide film such as SOG film. Alternatively, a lamination film with a TEOS silicon oxide film can be used for the prevention of diffusion of impurities. It is preferred that the surface of the interlayer insulating film 9 has been planarized by the CMP method or etchback method.

The interconnection 10 and dummy interconnection 11 are made of the same material and formed by the same step (same layer). Examples of the material include metals, such as aluminum (Al) and copper (Cu). They may alternatively be made of a polycrystalline silicon film doped with impurities at a high concentration. In the case of the polycrystalline silicon film, the surface thereof may be converted into a silicide.

Figure 2:
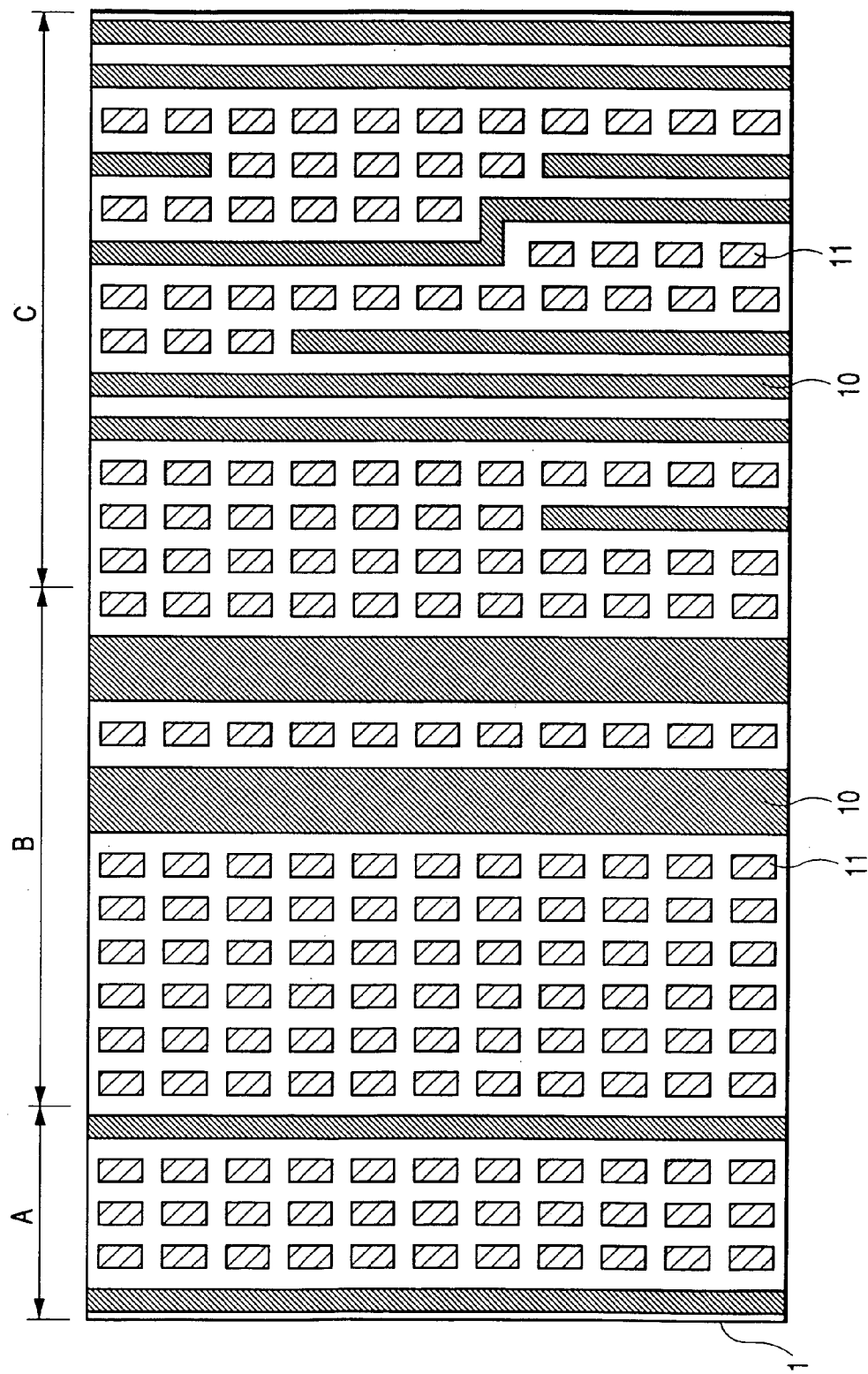
FIG. 2 is a fragmentary plan view illustrating the layout of the interconnections and dummy interconnections in the first interconnection layer in FIG. 1.

FIG. 2 is a plan view illustrating the layout of the interconnections 10 and dummy interconnections 11 in the first layer. The dummy interconnections 11 are formed in a region (void region) where the space between adjacent interconnections 10 is wide. As a result, the dummy interconnections are placed evenly in a region where the interconnections 10 have not been disposed, the space between the adjacent members of the dummy interconnections 11 and interconnections 10 becomes narrow; and the dummy interconnections seem to be filled in the void region densely.

The dummy interconnections 11 are formed also in the scribing area A, whereby the flatness of an insulating film 12 is maintained all over the semiconductor substrate 1, which will be described later. The width and length of the dummy interconnection 11 formed in the scribing area A are constituted so as to be not greater than the distance between the bonding pads.

Figure 3A:
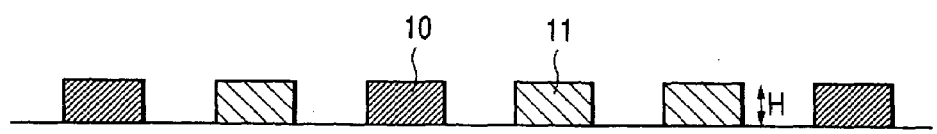
FIG. 3(b) is a plan view illustrating a layout rule applied to the layout of the interconnections and dummy interconnections and FIG. 3(a) is a cross-sectional view taken along a line A—A of FIG. 3(b)
Figure 3B:
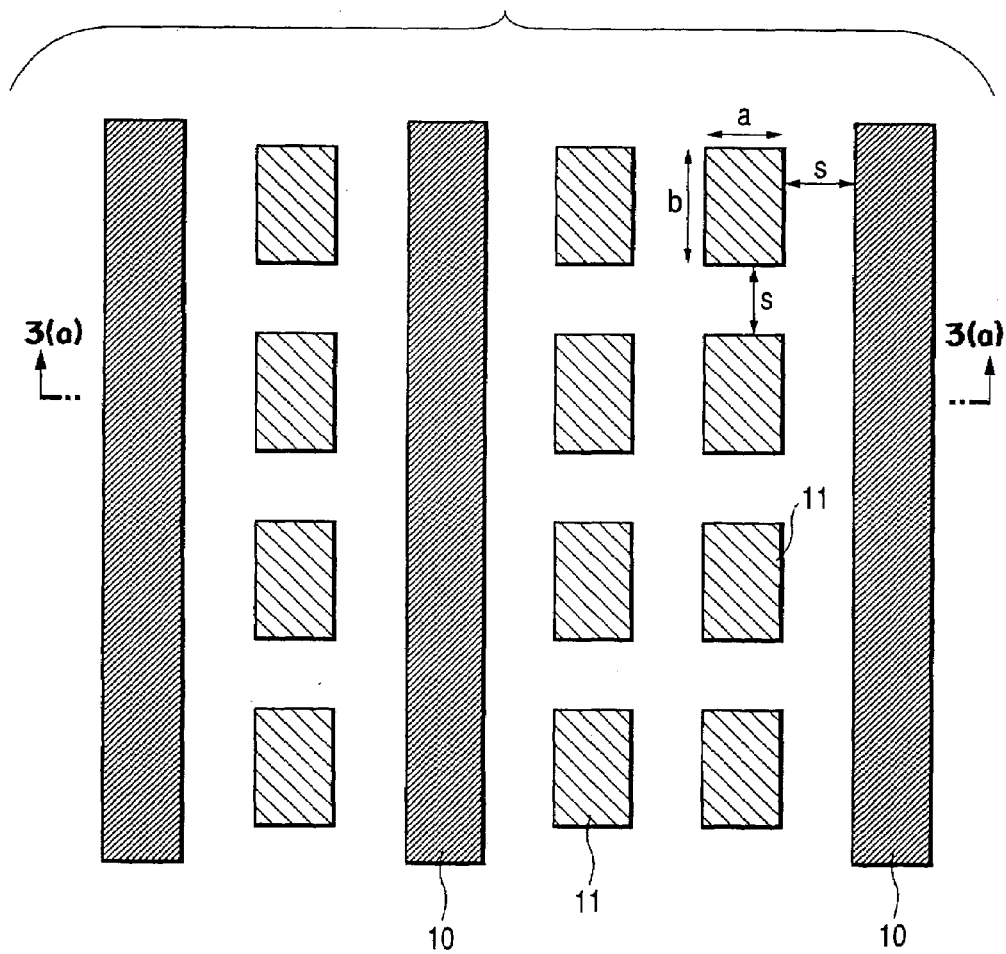

FIG. 3(b) is a plan view illustrating a layout rule applied to the placement of the interconnections 10 and the dummy interconnections 11, and FIG. 3(a) is a cross-sectional view taken along a line A—A of FIG. 3(b).

Figure 30:
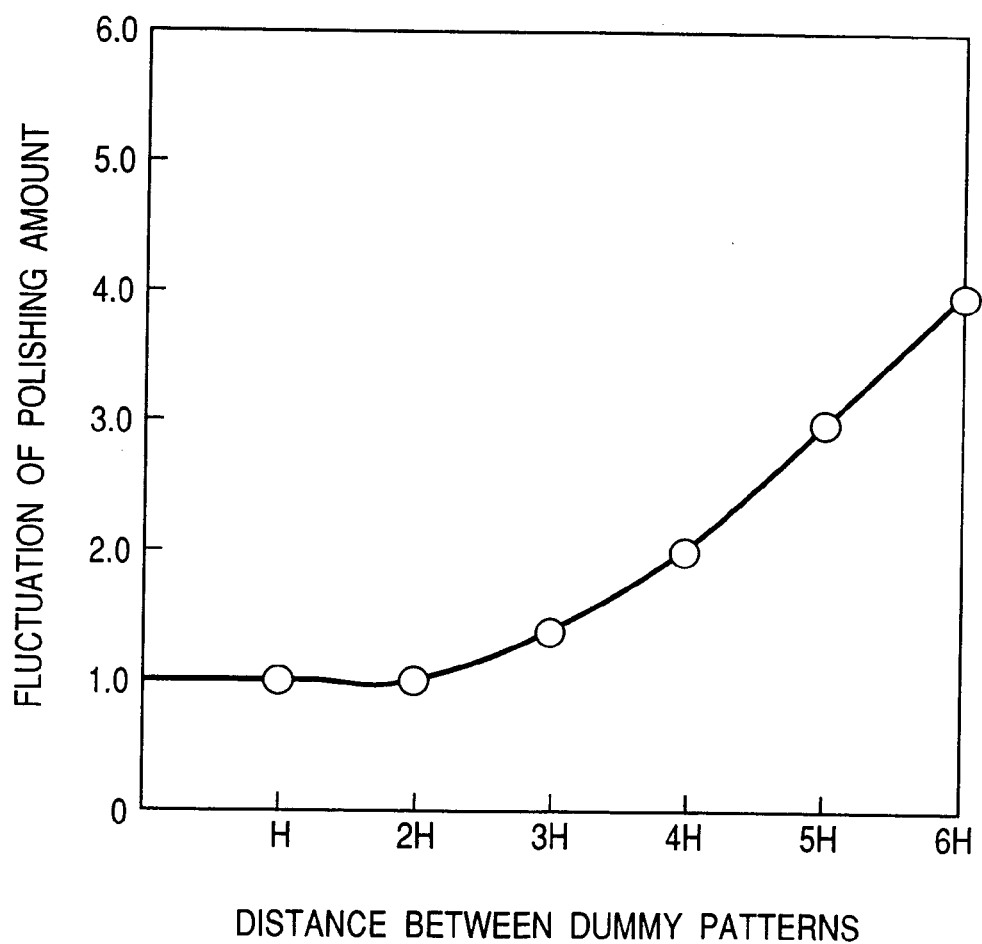
FIG. 30 is a graph illustrating the fluctuations of CMP polishing amount relative to the distance between patterns.

The member space S, which is a space between the interconnection 10 and the dummy interconnection 11, or a space between adjacent dummy interconnections 11, is not greater than twice the height of the interconnection height H of the dummy interconnection 11 or interconnection 10. As described above with reference to FIG. 30, by setting the member space S at not greater than twice the interconnection height H, the CMP polishing amount of the insulating film 12 can be made uniform and the surface of the insulating film 12 can be completely planarized. In a region not wider than 5% of the chip area, the member space S is allowed to have a height of at most four times the interconnection height H. In this case, although the fluctuations of the polishing amount of the insulating film 12 increase about twice, they can be neglected as a whole because this area amounts to not greater than 5% of the chip area. The flatness of the whole insulating film 12 therefore can be substantially maintained.

In addition, as the member space S, a space not smaller than the minimum space width required by a lithographic tool is necessary. This condition permits accurate processing of the interconnection 10 and dummy interconnection 11, whereby each member can be processed accurately according to the design. In the case of an exposure apparatus using a KRF exima laser as a light source, 0.2 µm can be given as an example of the minimum space width.

The width (a) of the dummy interconnection 11 is set to be not smaller than the minimum line width required by a lithographic tool. By setting the width (a) to be not smaller than the minimum line width, the dummy interconnections 11 can be processed with certainty. In the scribing area, the width (a) of each of the dummy interconnections 11 is set at not greater than the distance between bonding pads 13. By doing so, even if the dummy interconnections 11 are peeled off into minute chips by dicing or the like and produce conductive dust, no short circuit occurs between the bonding pads 13, which makes it possible to eliminate a cause for possible failure. The width (a) of each of the dummy interconnections 11 is set to be, for example, not greater than 30 µm, with 20 µm being frequently employed and with 10 µm being preferred. The distance between the bonding pads 13 can be set at about 10 µm. Even if the dummy interconnections 11 of such a size are formed, the parasitic capacitance of the interconnection 10 does not increase and therefore does not cause a problem of retarding a signal transferred to the interconnection 10. As a result, the performance of the logic integrated circuit device is not deteriorated.

The length (b) of each of the dummy interconnections 11 is set at not less than twice the minimum line width, and in the scribing area, it is set at not greater than the distance between the bonding pads, for example, not greater than 10 µm. When the width (b) and length (a) of each of the dummy interconnections 11 are each set at the minimum line width, there is a possibility that proper resolution of the dummy interconnections 11 will not be attained. By setting the length (b) at least twice the minimum line width, the resolution of the dummy interconnections 11 can be carried out with certainty even if the width (a) is the minimum line width, which makes it possible to process it with certainty. For the same reason in the width (a), the length (b) is set at, for example, not greater than the distance between bonding pads, for example, not greater than 10 µm. Similar to the width (a), the length (b) of each of the dummy interconnections 11 is constituted at not greater than 30 µm, with 20 µm or less being frequently employed and with 10 µm or less being preferred.

In Embodiment 1, the dummy interconnections 11 are in a rectangular form, but may be in a triangular, trapezoidal, circular or another polygonal form so long as they satisfy the above-described conditions. For minimizing the parasitic capacitance of the interconnection 10, the size and number of the dummy interconnections 11 are each preferred to be as small as possible. For minimizing the parasitic capacitance of the interconnection 10 within a range satisfying the above-described conditions, it is most preferred to set the member space S at twice the interconnection height H, the width (a) of each of the dummy interconnections at the minimum line width and the length (b) of each of the dummy interconnections at not less than twice the minimum line width. In this Embodiment, for example, the dummy interconnections are constituted to have a width (a) of 0.6 to 1 µm and a length (b) of 10 to 25 µm.

The interconnections 10 and dummy interconnections 11 are covered with the insulating film 12. The surface of the insulating film 12 has been polished by the CMP method so that the film has a completely planarized surface.

Figure 4:
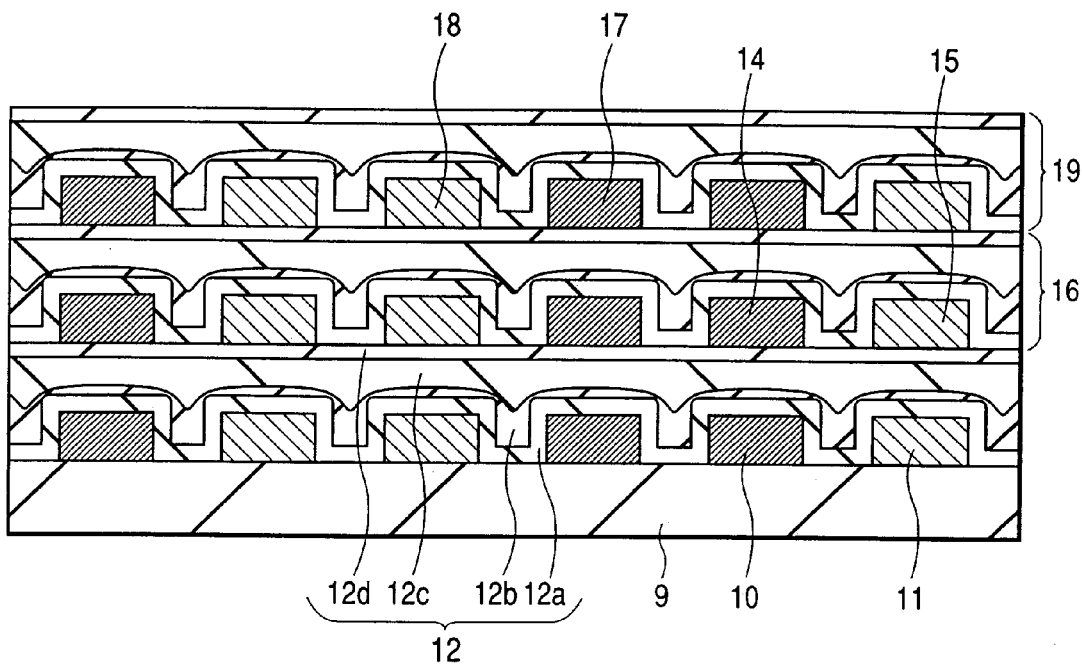
FIG. 4 is a cross-sectional view illustrating an enlarged interconnection portion in FIG. 1.

FIG. 4 is an enlarged cross-sectional view of the interconnection portion of FIG. 1. The insulating film 12 has an insulating film 12a, an insulating film 12b, an insulating film 12c and an insulating film 12d laminated in this order from the side contiguous to the interconnection 10 and dummy interconnection 11.

As the insulating film 12a, a silicon oxide film formed by the CVD method using TEOS can be employed for example. As illustrated in the drawing, the insulating film 12a is formed, faithfully tracing the surface line including a step difference. The film thickness can be set, for example, at 300 nm.

As the insulating film 12b, an inorganic SOG film, a silicon oxide film formed by the high-density plasma CVD method or a polysilazane film can be employed. In short, a film having properties for filling a concave portion therewith can be employed. As illustrated in the drawing, the film is embedded in the concave portion and the thickness of the film in the convex portion is formed to be thin. The reason why the concave portion can be embedded with the insulating film 12b is because the above-described dummy interconnections 11 are formed under the above-described conditions and the concave portion formed between adjacent dummy interconnections 11 is not greater than a given space necessary for embedding the insulating film 12b. The film thickness is for example set at 125 nm on the convex portion.

As the insulating film 12c, for example, a silicon oxide film formed by the CVD method using TEOS can be employed, with its surface being polished by the CMP method. The existence of the dummy interconnections 11 has enabled complete planarization of the polished surface. This film can be formed to give a thickness of 500 nm on the convex portion.

As the insulating film 12d, a silicon oxide film formed by the CVD method using TEOS can be employed. It has, for example, a film thickness of 200 nm. Incidentally, the insulating film 12d can be omitted. In such a case, it is necessary to add the thickness of the insulating film 12d to the thickness of the insulating film 12c upon deposition of the insulating film 12c.

Over the insulating film 12, interconnections 14, dummy interconnections 15 and an insulating film 16 of the second interconnection layer are formed, over which interconnections 17, dummy interconnections 18 and an insulating film 19 of the third interconnection layer are formed and then, interconnections 20, dummy interconnections 21 and an insulating film 22 are formed. The interconnections 14, 17 and 20, dummy interconnections 15, 18 and 21 and insulating films 16, 19 and 22 are formed similarly to the interconnection 10, dummy interconnection 11 and insulating film 12 of the first interconnection layer, respectively.

Over the fourth interconnection layer, interconnections 23 and an insulating film 24 of the fifth interconnection layer are formed followed by the formation of a passivation film 25. As the passivation film 25, for example, a silicon nitride film can be employed. The interconnections 23 include the bonding pad 13.

A process for the fabrication of the logic integrated circuit device of Embodiment 1 will next be described with reference to FIGS. 5 to 11, which are cross-sectional views illustrating one example of the fabrication process of the logic integrated circuit device of Embodiment 1 in the order of the steps thereof.

As illustrated in FIG. 5, on a semiconductor substrate 1, a shallow trench 2 is formed using photolithography and etching techniques. On the principal surface of the semiconductor substrate 1 having the shallow trench 2 formed therein, a silicon oxide film is deposited, and then, it is polished by the CMP method or the like to form an element isolation region 3. Then, N-type and P-type well regions may be formed.

As illustrated in FIG. 6, a silicon oxide film to be a gate insulating film 5 is then formed by the thermal oxidation or thermal CVD method, followed by the deposition of a polycrystalline silicon film by the CVD method. The polycrystalline silicon film is patterned using photolithography and etching techniques, whereby a gate interconnection 6 (gate electrode 7) is formed. With the gate electrode 7 serving as a mask, impurities are subjected to ion implantation in self alignment relative to the gate electrode 7, whereby an impurity semiconductor region 8 is formed. After the deposition of a silicon oxide film, anisotropic etching is conducted, whereby a side-wall spacer 8b is formed. It is possible to carry out ion implantation of highly-concentrated impurities to form the impurity semiconductor region 8 as a so-called LDD structure.

Figure 7:
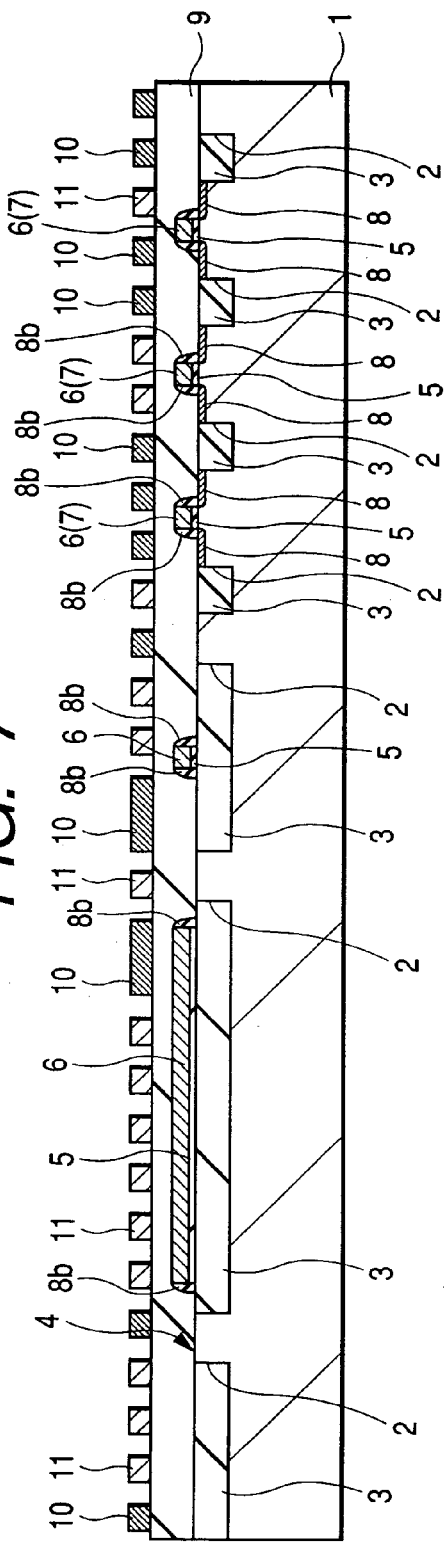
FIG. 7 is a cross-sectional view illustrating one example of the fabrication process of the logic integrated circuit device according to Embodiment 1 in the order of the steps.

As illustrated in FIG. 7, a PSG film is formed, followed by planarization by the etchback or CMP method, whereby an interlayer insulating film 9 is formed. Over the interlayer insulating film, an aluminum film is deposited by the sputtering or deposition method. The aluminum film so obtained is patterned by photolithography and etching techniques, whereby interconnections 10 and dummy interconnections 11 are formed. Patterning is conducted in accordance with the conditions as described above with regards to the dummy interconnections 11.

Figure 8:
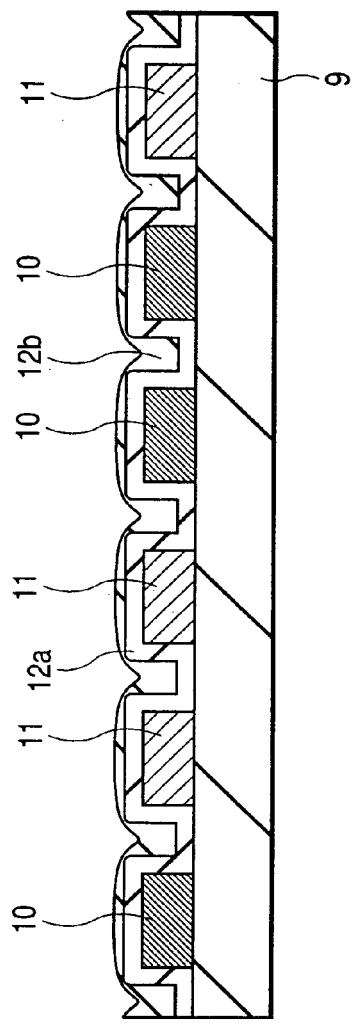
FIG. 8 is a cross-sectional view illustrating one example of the fabrication process of the logic integrated circuit device according to Embodiment 1 in the order of the steps.

As illustrated in FIG. 8, an insulating film 12a is formed by the CVD method using TEOS. As the CVD method, a plasma CVD method can be employed, but a thermal CVD method using ozone in combination can be employed alternatively. The film thickness of the insulating film 12a is set at 300 nm. Incidentally, FIGS. 8 to 11 are cross-sectional views each illustrating only an interconnection layer and the layers therebelow are omitted.

Then, an insulating film 12b is formed using an inorganic SOG film and gaps formed by adjacent ones of the interconnections 10 and dummy interconnections 11 are filled therewith. The inorganic SOG film can be formed by coating inorganic SOG and then baking it. The film thickness of the insulating film 12b is set at 125 nm on the convex portion. Incidentally, the insulating film 12b may be a silicon oxide film formed by the high-density plasma CVD method or a polysilazane film.

Since the width of the gap is narrow owing to the formation of the dummy interconnections 11, it becomes possible to embed the gap with the insulating film 12b favorably. In other words, the film thickness in the concave portion is made thicker than that on the convex portion. As a result, the unevenness on the surface of the insulating film 12b is lessened and the difference in the height can be reduced.

Figure 9:
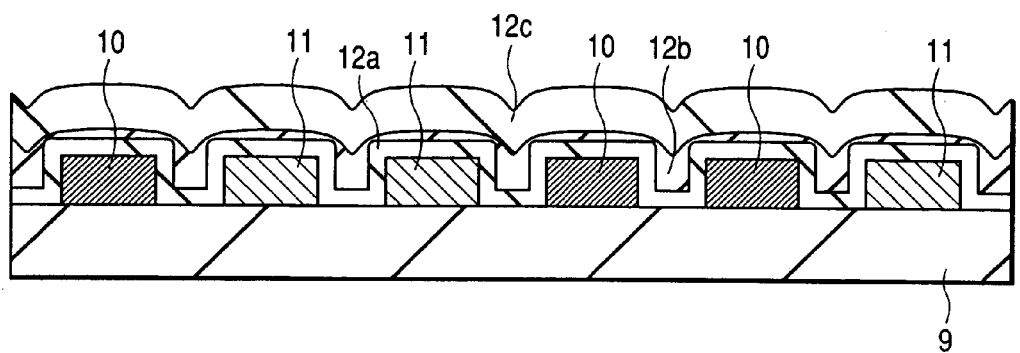
FIG. 9 is a cross-sectional view illustrating one example of the fabrication process of the logic integrated circuit device according to Embodiment 1 in the order of the steps.

As illustrated in FIG. 9, an insulating film 12c is then formed by the CVD method using TEOS. The insulating film 12 can be formed to have a film thickness of 700 nm. In the case where no dummy interconnection is disposed as is illustrated in FIG. 29, the thickness of the insulating film 12c is required to be about 1700 nm, but in Embodiment 1, the thickness can be decreased to 700 nm because of the presence of the dummy interconnections 11. As a result, the step for deposition the insulating film 12 can be shortened, whereby the step load can be reduced.

Figure 10:
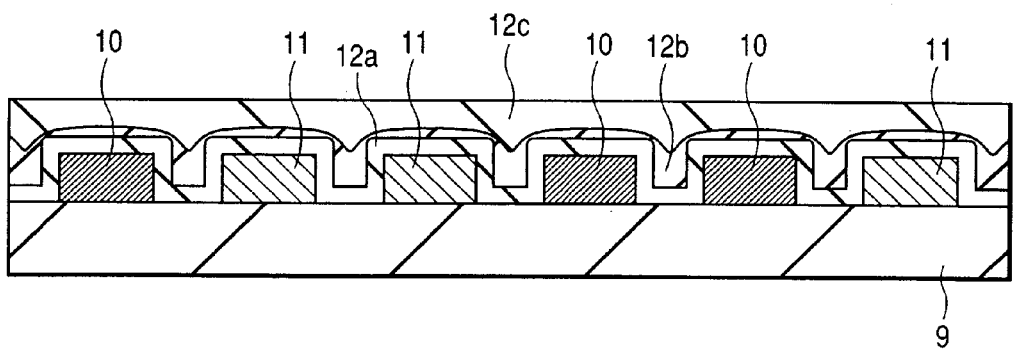
FIG. 10 is a cross-sectional view illustrating one example of the fabrication process of the logic integrated circuit device according to Embodiment 1 in the order of the steps.

As illustrated in FIG. 10, the surface of the insulating film 12c is then polished by the CMP method and planarized. In Embodiment 1, the surface shape of the insulating film 12c reflects the shapes of the interconnections 10 and dummy interconnections 11, as well as that of the insulating film 12b, so that the insulating film 12c has substantially an even height at any place. As a result, the polishing rate becomes substantially uniform irrespective of the locations, whereby the surface of the insulating film 12c can be substantially planarized. In addition, the insulating film 12c has a film thickness as little as 700 nm, which makes it possible to reduce the CMP polishing amount and to reduce the load of the CMP polishing step. Incidentally, the polishing amount can be decreased to 200 nm.

Figure 11:
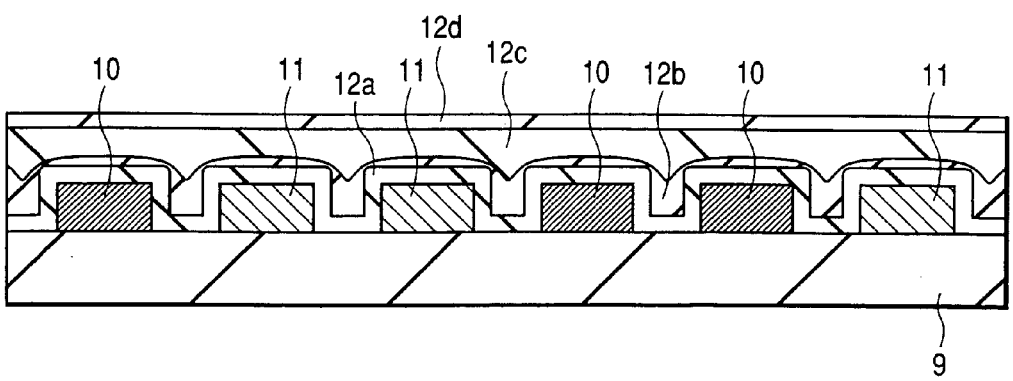
FIG. 11 is a cross-sectional view illustrating one example of the fabrication process of the logic integrated circuit device according to Embodiment 1 in the order of the steps.

Then, a surface washing after CMP polishing is effected, followed by the formation of an insulating film 12d by the CVD method using TEOS, as is illustrated in FIG. 11. The insulating film 12d can be formed to have a thickness of 200 nm. Incidentally, it is possible to omit the insulating film 12d and to form the insulating film 12c to have a thickness of 900 nm.

In this manner, the first interconnection layer is completed. Similar to the first interconnection layer, the second to fourth interconnection layers are then formed, followed by the formation of the fifth interconnection layer similarly. Over the fifth interconnection layer, a passivation film 25 is formed, whereby the logic integrated circuit device as illustrated in FIG. 1 is almost completed.

According to the fabrication process of Embodiment I, the surfaces of the insulating films 12, 16, 19 and 22 are completely planarized and at the same time, the step for deposition of an insulating film to be polished by CMP and CMP polishing step can be shortened, whereby step loads can be reduced. In general, such an advantage becomes particularly marked when a multi-layer interconnection, such as a logic device, composed of at least 3 layers is formed.

Incidentally, an interconnection layer composed of five layers is exemplified in this Embodiment 1, however, it may be formed of any number of layers either greater or less than five layers.

(Embodiment 2)

Figure 12:
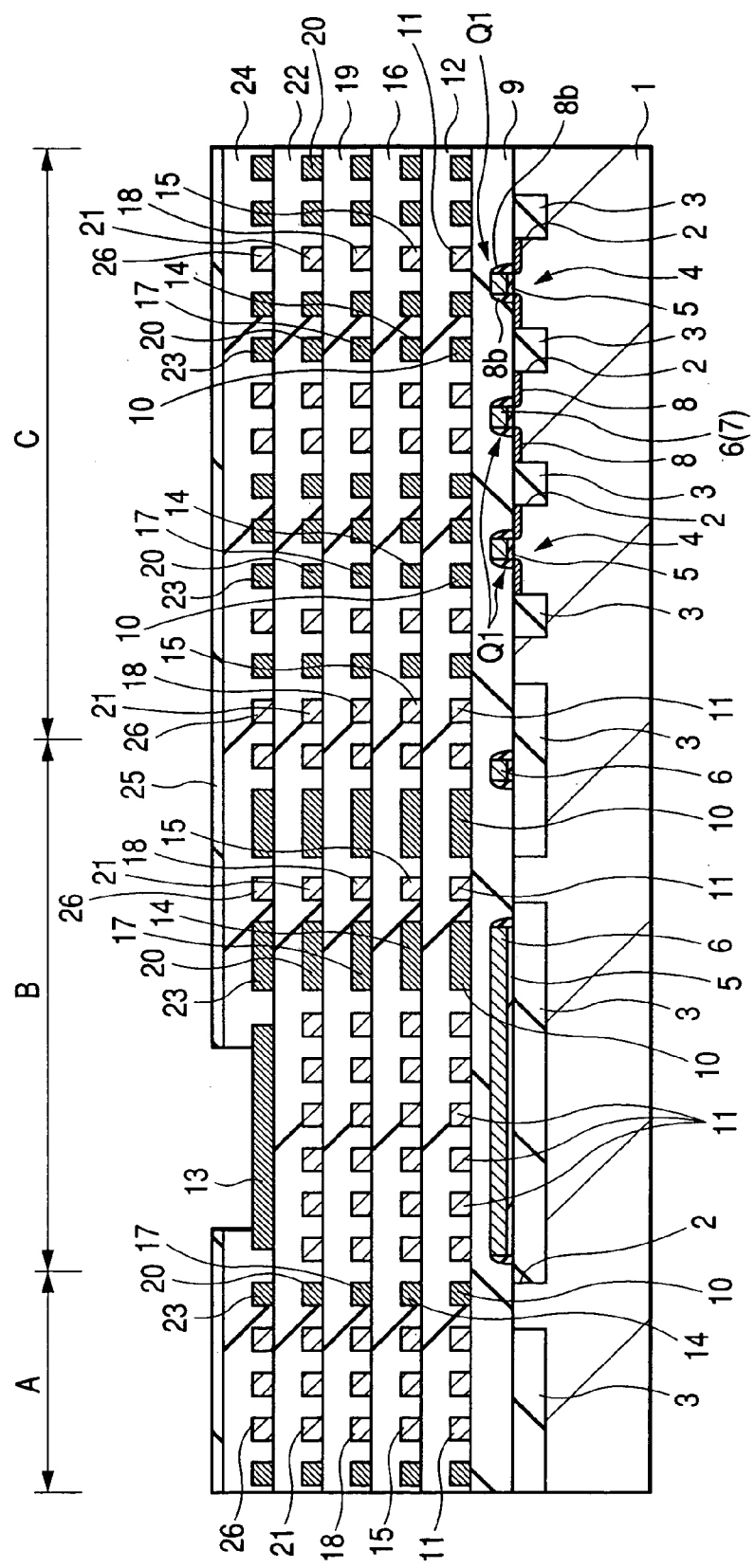
FIG. 12 is a cross-sectional view illustrating one example of a logic integrated circuit device according to Embodiment 2.

FIG. 12 is a cross-sectional view illustrating one example of a logic integrated circuit device according to Embodiment 2 of the present invention.

The logic integrated circuit device according to Embodiment 2 is substantially similar to that of Embodiment 1 except for the fifth interconnection layer. Accordingly, description of the common features is omitted herein and only the differences will be described below.

The logic integrated circuit device according to Embodiment 2 has, in the fifth interconnection layer, dummy interconnections 26 in addition to interconnections 23. The dummy interconnections 26 are disposed under substantially similar conditions to the dummy interconnections 11 described in Embodiment 1. The interconnections 23 of the fifth interconnection layer however include the bonding pad 13 so that the disposing conditions of the dummy interconnections 26 are different at the periphery of the bonding pad 13.

Figure 13:
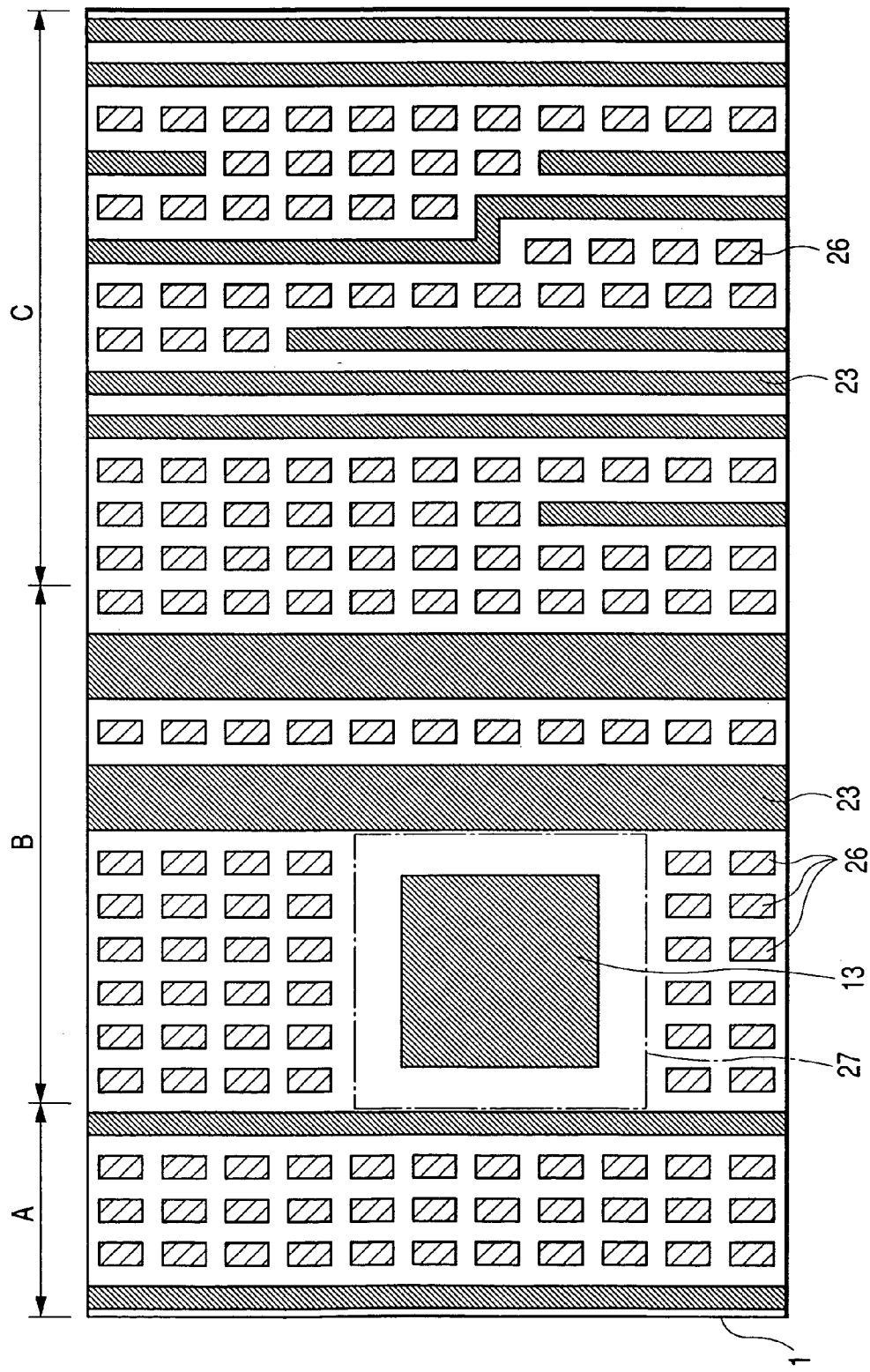
FIG. 13 is a plan view illustrating a layout of interconnections and dummy interconnections in the fifth interconnection layer.

FIG. 13 is a plan view illustrating the layout of the interconnections 23 and the dummy interconnections 26 of the fifth interconnection layer. At the periphery of the bonding pad 13, a prohibited area 27 free from dummy interconnections 26 is disposed. The prohibited area 27 can extend within a range of 20 μm from each end of the bonding pad 13.

Figure 14:
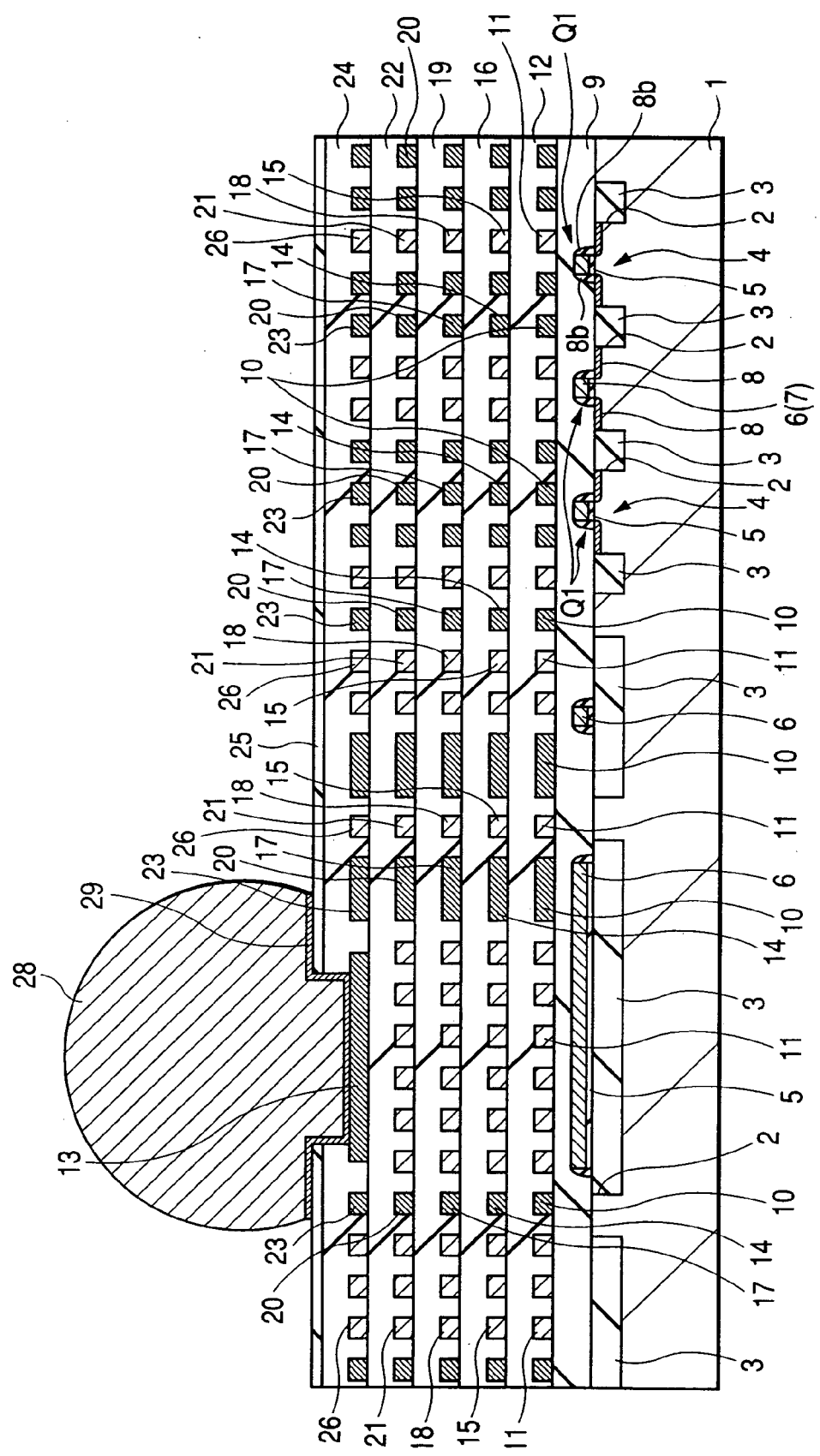
FIG. 14 is a cross-sectional view illustrating one example of a logic integrated circuit device according to Embodiment 3 of the present invention.

Such a logic integrated circuit device makes it possible to completely planarize also the surface of the passivation film 25, because the dummy interconnections 26 are formed in the fifth interconnection layer. As a result, it becomes possible to carry out processing of a BLM (Ball Limiting Metalization) film 29, which is to be an underground film for a bump 28, as illustrated in FIG. 14. In addition, by disposing the prohibited area 27 at the periphery of the bonding pad 13, automatic detection of the bonding pad 13 by a wire bonding apparatus can be conducted with certainty.

Figure 15A:
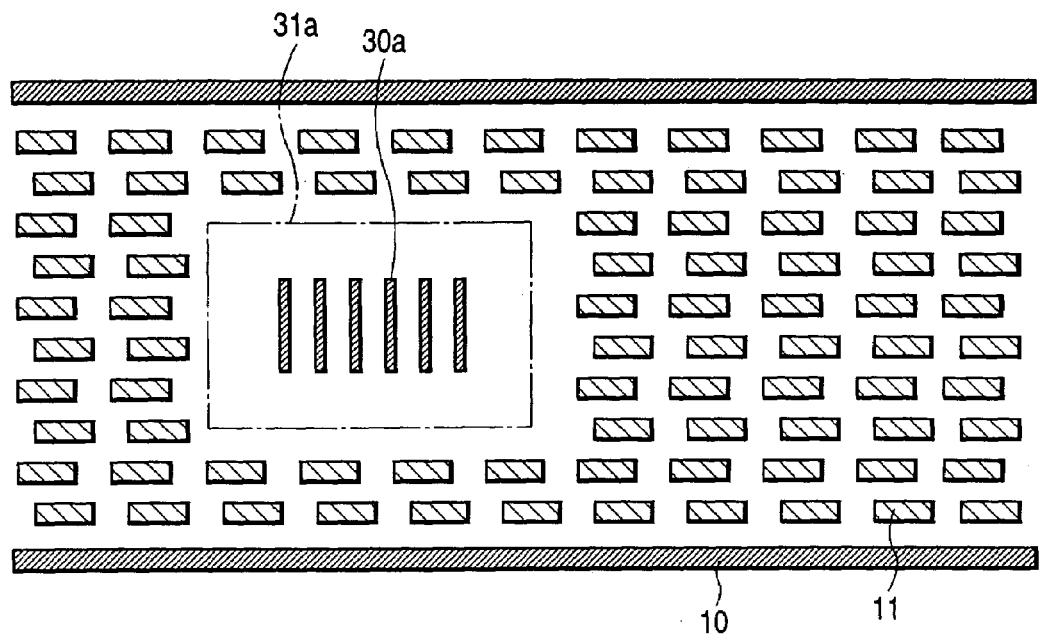
FIGS. 15(a) and (b) are each a plan view illustrating another example of the logic integrated circuit device according to Embodiment 3.
Figure 15B:
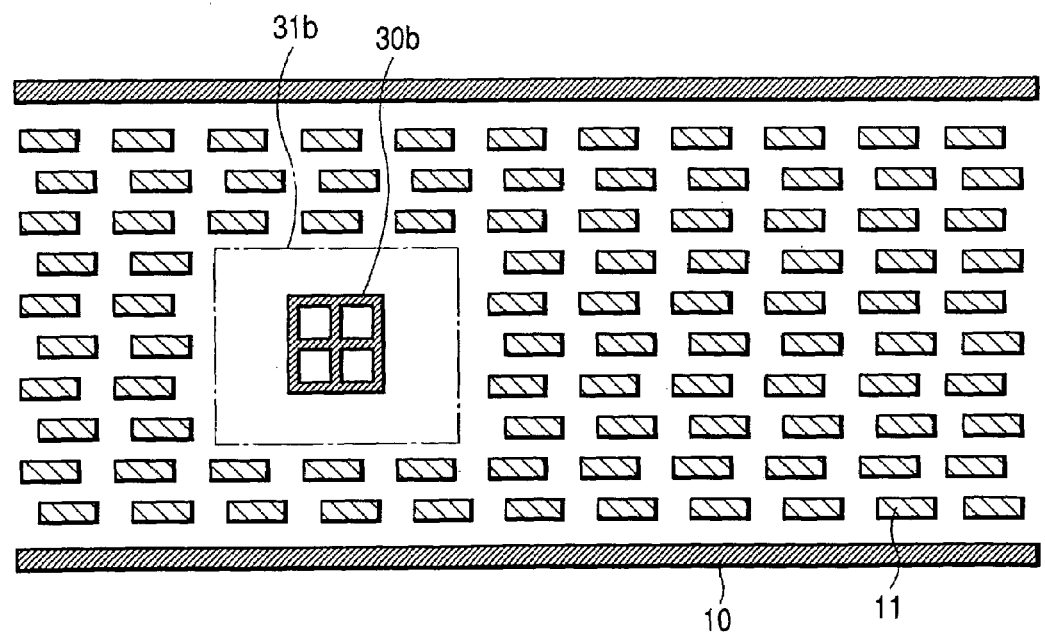

Incidentally, in the present Embodiment 2 and also the above-described Embodiment 1, the dummy interconnections 11, 15, 18, 21 and 26 can be formed in the scribing area A. When markers 30*a* and 30*b* for lithography are formed, as illustrated in FIGS. 15(*a*) and 15(*b*), respectively, in the scribing area A or another area, prohibited areas 31*a* and 31*b* free from the placement of the dummy interconnections 11, 15, 18, 21 or 26 can be disposed in the vicinity of the markers. The prohibited area 31*a* or 31*b* can be disposed within a range of 60 μm from each end of the marker 30*a* or 30*b*.

By disposing such a prohibited area 31*a* or 31*b*, it becomes possible to carry out automatic detection of the marker 30*a* or 30*b* favorably by an exposure apparatus used for photolithography. Incidentally, the prohibited area 31*a* or 31*b* is formed for at least the dummy interconnections 26 of the uppermost interconnection layer, and it is not necessary to apply it to the dummy interconnections 11, 15 and 18 in the lower interconnection layers. Alternatively, it is not necessary to dispose the-dummy interconnections themselves.

(Embodiment 3)

Figure 16:
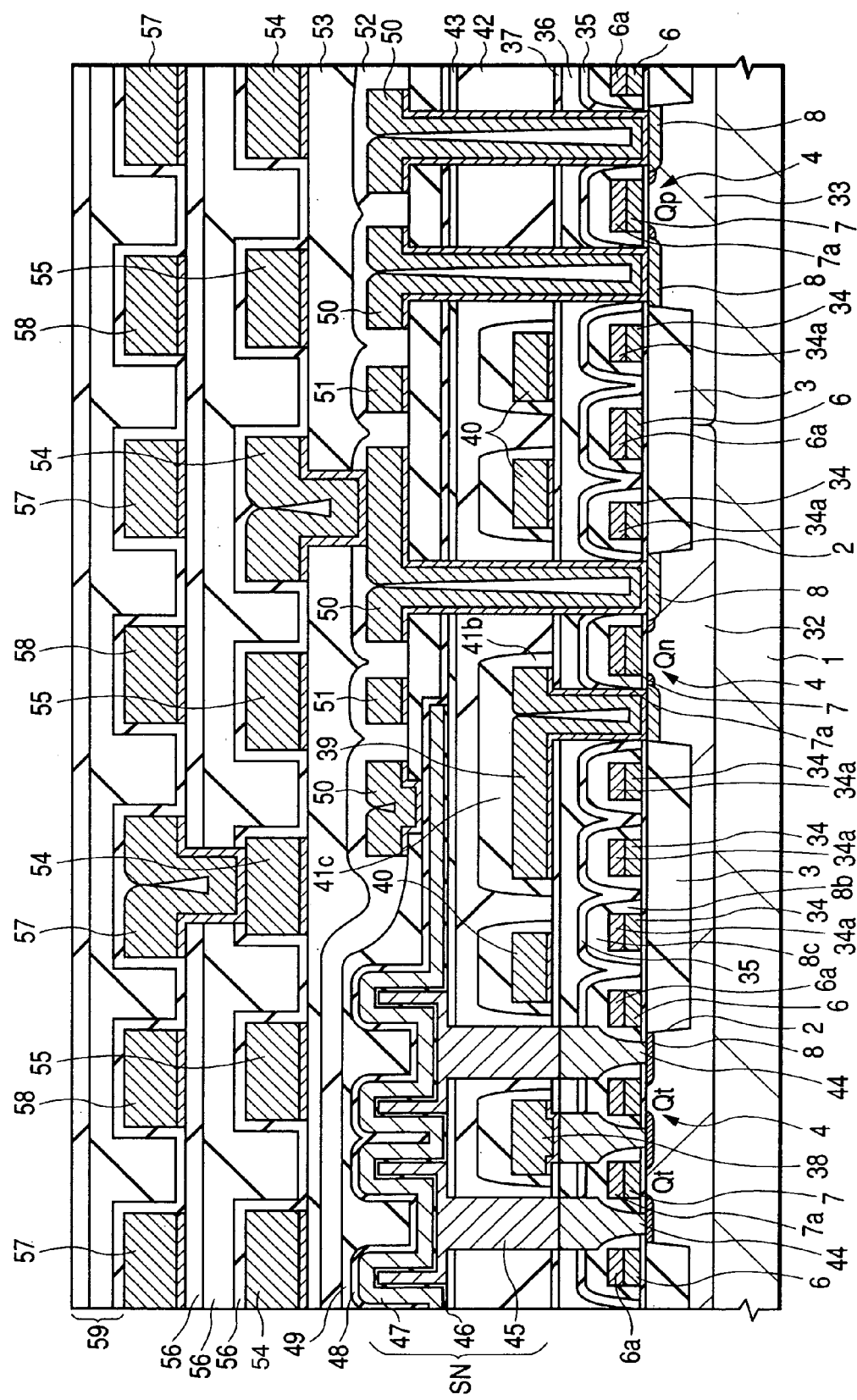
FIG. 16 is a cross-sectional view illustrating one example of DRAM according to Embodiment 3.

FIG. 16 is a cross-sectional view illustrating one example of a DRAM which represents Embodiment 3 of the present invention.

A semiconductor substrate 1, a shallow trench 2, an element isolation region 3 and an active region 4 of DRAM according to Embodiment 3 are similar to those of Embodiment 1. On the principal surface of the semiconductor substrate 1, a p-type well region 32 and an n-type well region 33 are formed.

In the active region 4 of the p-type well region 32, a selective MISFETQt constituting a memory cell M of the DRAM and a MISFETQn of a peripheral circuit are formed, while in the active region 4 of the n-type well region 33, MISFETQp of the peripheral circuit is formed. In FIG. 16, shown on the left side is a memory cell area, while on the center and right side, a peripheral circuit area is shown. The memory cell M of the DRAM has a selective MISFETQt and a storage element SN which is a capacitative element.

Gate electrodes 7 for MISFETQt, MISFETQn and MISFETQp are each formed of a polycrystalline silicon film, said film having a suicide layer 7*a* on the surface thereof. In the active region 4 existing on both sides of the gate electrode 7 for MISFETQt, MISFETQn or MISFETQp, impurity semiconductor regions 8 are formed and constitute a source and drain region of the MISFET. The conductivity type of the impurity semiconductor region 8 differs depending on the conductivity type of the MISFET. The MISFETQt and the MISFETQn have an n-type conductivity, while the MISFETQp has a p-type conductivity. Incidentally, concerning the MISFETQn and MISFETQp of the peripheral circuit, the impurity semiconductor regions 8 are illustrated to have an LDD structure, but it is not necessary that they have an LDD structure.

Figure 17:
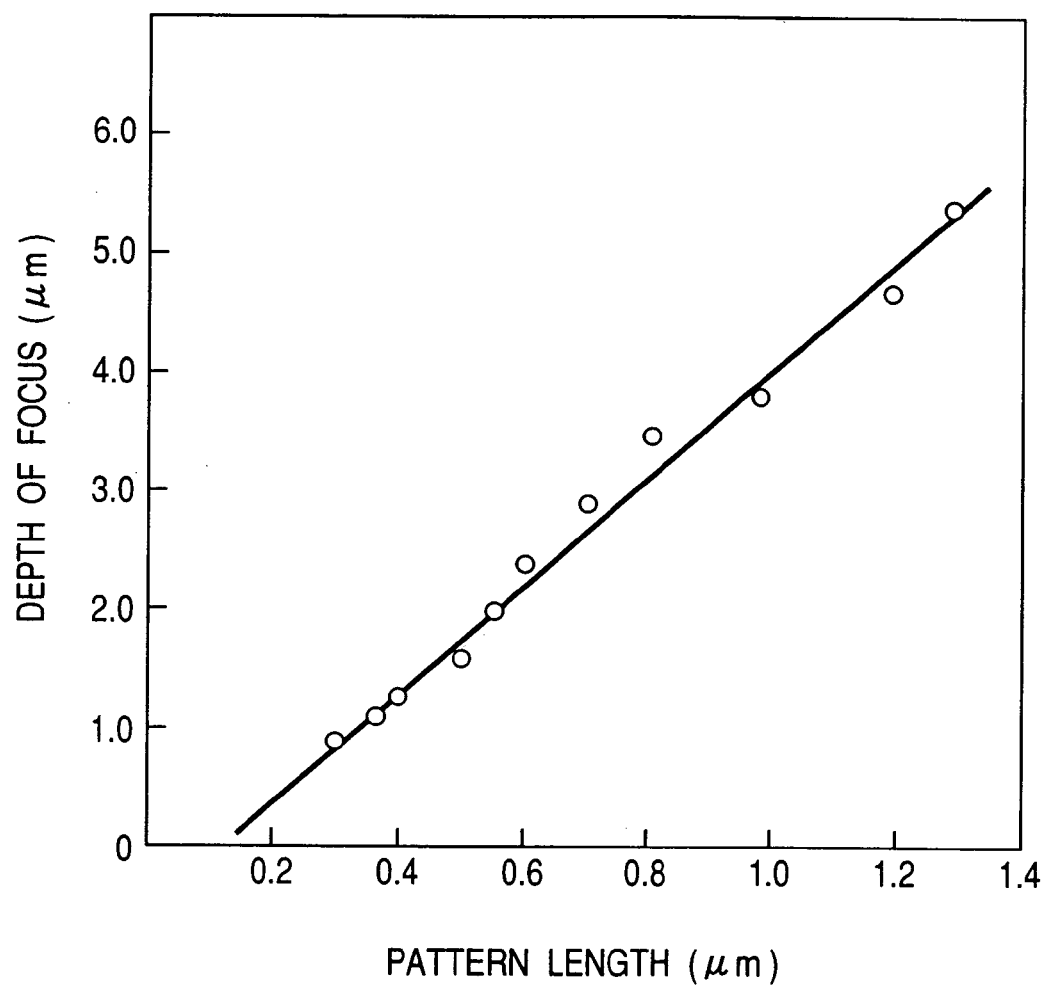
FIG. 17 is a graph illustrating a relationship between a pattern size and focus depth of lithography.

In the layer where the gate electrodes 7 exist, gate interconnections 6 and dummy gate interconnections (dummy members) 34 are formed. The gate electrodes 7 are also part of the gate interconnections 6. Since the gate interconnections 6 and dummy gate interconnections 34 are formed simultaneously with the gate electrodes 7 (in the same layer), silicide layers 6*a* and 34*a* are formed on the surfaces thereof. On the side walls and upper surfaces of the gate interconnections 6 and dummy gate interconnections 34, side walls 8*b* and cap insulating films 8*c*, each formed of a silicon oxide film, are formed, over which an insulating film 35 is formed. The insulating film 35 may be formed of, for example, a TEOS silicon oxide film. Over the insulating film 35, an insulating film 36 planarized by the CMP method is formed. The insulating film 36 may be formed, for example, of a BPSG film. In Embodiment 3, dummy gate interconnections 34 are disposed so that the insulating film 36 can be almost completely planarized. Even if the focus depth of the lithography becomes shallow, such complete planarization makes it possible to mass-produce the products, on which minute patterns on the level of 0.2 μm have been formed, as illustrated by FIG. 17.

The dummy gate interconnections 34 are disposed under similar conditions to those for the dummy interconnections 11 described in Embodiment 1. Incidentally, the dummy gate interconnections 34 are not disposed in a region where a contact hole is to be formed, which makes it possible to open the contact hole smoothly. The dummy gate interconnections 34 are formed mainly on the element isolation region 3.

Over the insulating film 36, an insulating film 37 composed of, for example, a silicon oxide film formed using TEOS can be formed. Alternatively, it can be omitted. Over the insulting film 37, in addition to the bit line 38 of the DRAM, interconnections 39 and dummy interconnections 40, which are formed in the same layer with the bit line, are formed. These interconnections can be composed of a polycrystalline silicon film having, for example, a CVD tungsten film as an adhesive layer. The dummy interconnections 40 are formed in accordance with the conditions employed for the above-described dummy interconnections 11 of Embodiment 1. However, they are not disposed in a region having a contact hole formed therein, whereby the contact hole can be opened smoothly. On the side walls and upper surfaces of the bit line 38, interconnection 39 and dummy interconnection 40, side walls 41b and cap insulating film 41c, each composed of a silicon oxide film, are formed, over which an insulating film 42 is laid. The insulating film 42 is composed of, for example, a BPSG film which has been polished by the CMP method for planarization. Incidentally, an insulating film 43 composed of a silicon oxide film formed using TEOS can be formed over the insulating film 42, but alternatively, it can be omitted. In this Embodiment 3, the dummy interconnections 40 are disposed, which makes it possible to planarize the insulating film 42 almost completely.

Over the insulating film 43, a storage capacitative element SN of the DRAM and a first metal interconnection layer are formed. The storage capacitative element SN is constituted of a lower electrode 45 which is connected with the impurity semiconductor region 8 of a MISFETQt through a plug 44, and a plate electrode 47 formed opposite to the lower electrode 45 through a capacitative insulating film 46. The storage capacitative element SN is covered with an insulating film 48. It is also covered with an insulating film 49 composed of a silicon oxide film formed, for example, by the high-density plasma method. Over the insulating film 49, the interconnections so and dummy interconnections 51 of the first interconnection layer are formed. Each of the interconnections so is connected through the contact hole with a plate electrode 47 or an impurity semiconductor region 8 on the principal surface of the semiconductor substrate 1. The interconnections so and dummy interconnections 51 are formed simultaneously, and they are composed of, for example, a tungsten film having as an adhesive layer CVD tungsten or an aluminum film. The dummy interconnections 51 are disposed under similar conditions to those described in Embodiment 1 with regard to the dummy interconnections 11. However, they are not disposed in a memory mat region in which the storage capacitative element SN is to be formed.

The interconnections 50 and dummy interconnections 51 are covered with an insulating film 52 composed of, for example, a silicon oxide film formed by the high-density plasma CVD method or a polysilazane film. Over the insulating film 52, an insulating film 53 composed of a TEOS silicon oxide film is formed. The insulating film 53 is polished by the CMP method and planarized. It has almost complete flatness because of having therebelow the dummy interconnections 51. The insulating film 53 is overlaid with interconnections 54, dummy interconnections 54 and an insulating film 56 of the second layer, followed by the formation of the interconnections 57, dummy interconnections 58 and an insulating film 59 of the third layer. The interconnections 54, dummy interconnections 55, insulating film 56, interconnections 57, dummy interconnections 58 and insulating film 59 are formed in a similar manner to the interconnections 10, dummy interconnections ii and insulating film 12 in Embodiment 1.

The DRAM according to Embodiment 3 makes it possible to provide each insulating film with complete flatness because dummy members 34, 40, 51, 55 and 58 are disposed for the gate interconnections 6, bit line 38, interconnections so of the first layer, interconnections 54 of the second layer and interconnections 57 of the third layer. By disposing the dummy gate interconnections 34 and dummy interconnections 40, 51, 55 and 58 between the memory cell region and peripheral circuit area, the insulating film of each layer can be planarized.

Incidentally, the process for the fabrication of the DRAM of Embodiment 3 will next be described with reference to FIGS. 18 to 21. FIGS. 18 to 21 are cross-sectional views each illustrating one example of the fabrication process of the DRAM of Embodiment 3 in the order of the steps thereof.

The steps leading up to the formation of the element isolation region 3 on the principal surface of the semiconductor substrate 1 are similar to those of Embodiment 1 so that their description will be omitted.

Figure 18:
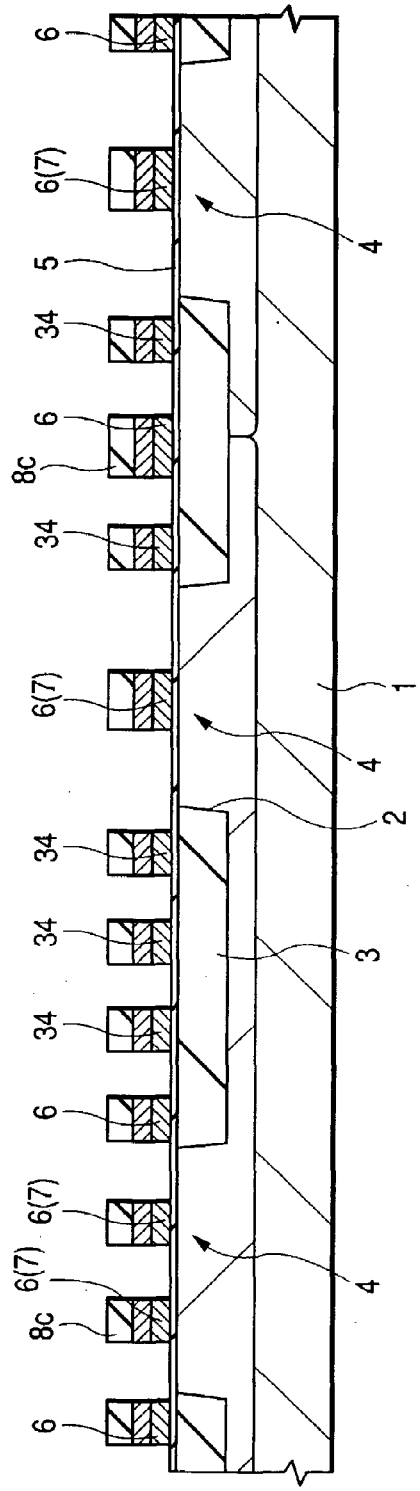
FIG. 18 is a cross-sectional view illustrating one example of the fabrication process of DRAM according to Embodiment 3 in the order of the steps.

Then, as illustrated in FIG. 18, a silicon oxide film, which will be a gate insulating film 5, is formed, followed by the deposition thereon of a polycrystalline silicon film to be a gate interconnection 6, gate electrode 7 and dummy gate interconnection 34, and then a silicon oxide film which will be formed as a cap insulating film 8c. These films so laminated are patterned, whereby the gate interconnection 6, gate electrode 7 and dummy gate interconnection 34 are formed. The gate interconnection 6 (gate electrode 7) is patterned in accordance with an ordinarily employed layout rule, while the dummy gate interconnection 34 is patterned so as to be disposed in the element isolation region 3, while substantially satisfying, in addition to the ordinarily employed layout rule, the conditions in Embodiment 1 concerning the dummy interconnection 11.

Figure 19:
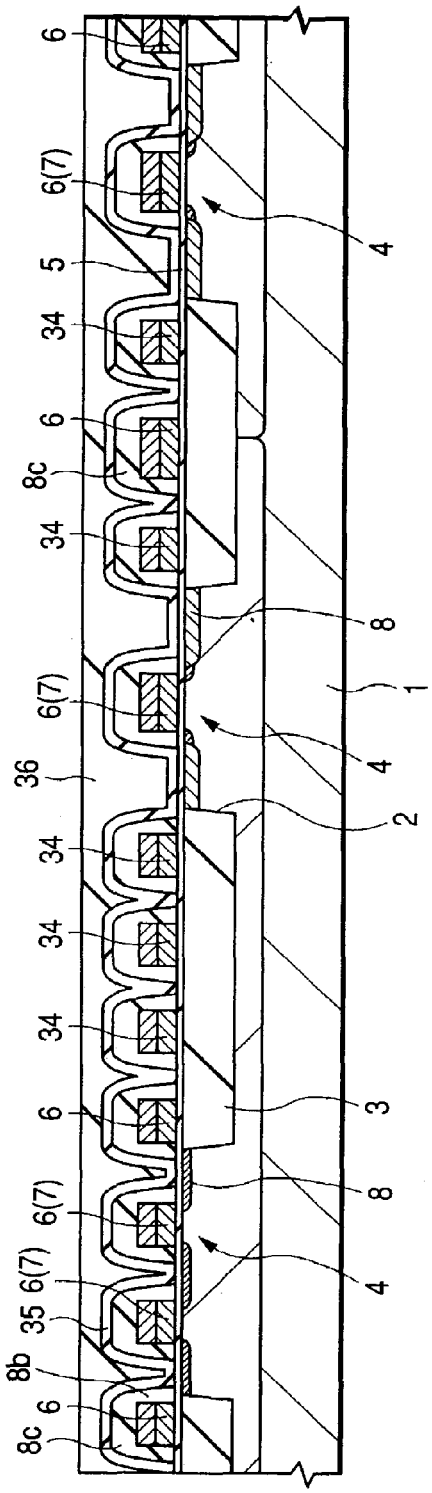
FIG. 19 is a cross-sectional view illustrating one example of the fabrication process of DRAM according to Embodiment 3 in the order of the steps.

Then, as illustrated in FIG. 19, a side-wall spacer 8b is formed, followed by the deposition of an insulating film 35 and then a BPSG film. The BPSG film is thereafter polished by the CMP method, whereby an insulating film 36 is formed. The BPSG film can be formed to give a thickness of 800 nm and the CMP polishing amount can be suppressed to 400 nm. When the dummy gate interconnections 34 are not formed, it is necessary to deposit a thicker BPSG film and the CMP polishing amount inevitably increases. As described above, by decreasing the thickness of the BPSG film and reducing the CMP polishing amount, advantages such as reduction in the step load can be brought about. Incidentally, instead of the BPSG film, a PSG film or a silicon oxide film formed by the high-density plasma CVD method can be employed. Also, the side wall spacer 8b and the cap insulating film 8c can each be formed of a silicon nitride film, instead. When the silicon nitride film is used, etching upon the opening of a contact hole can be carried out by self alignment.

Figure 20:
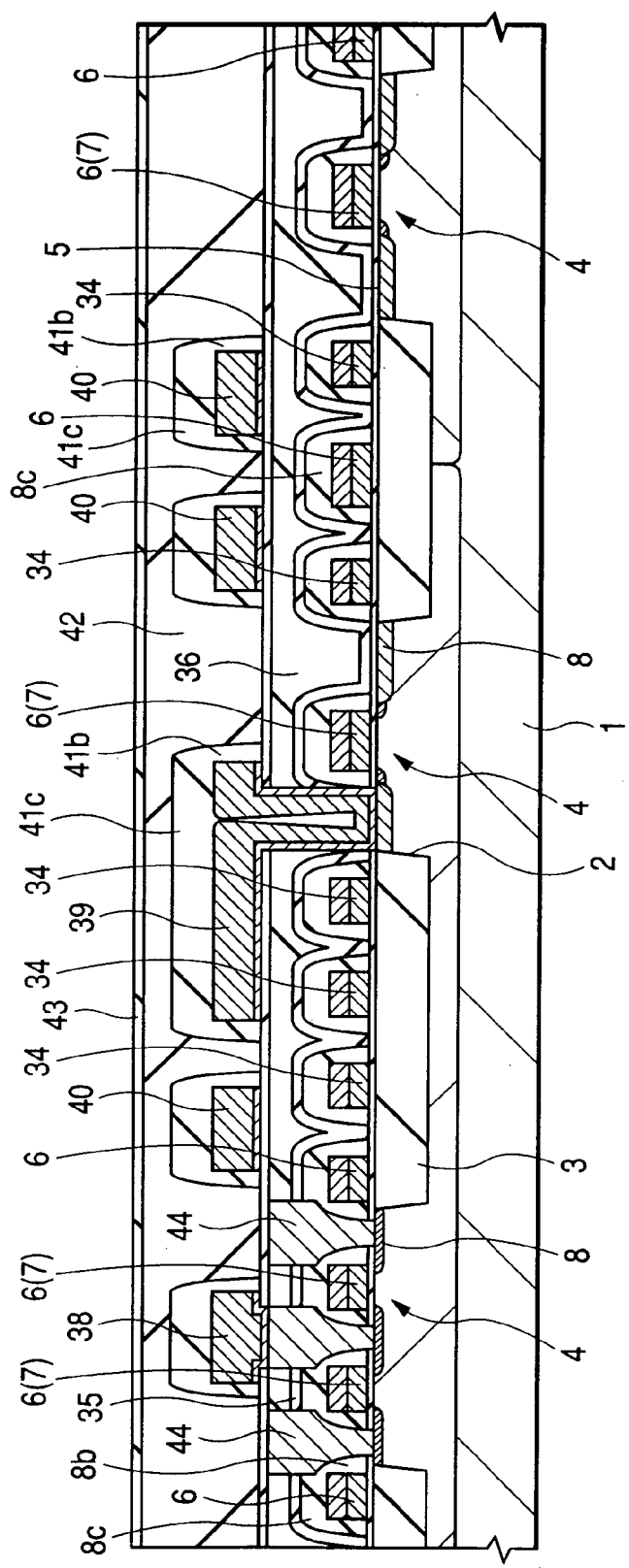
FIG. 20 is a cross-sectional view illustrating one example of the fabrication process of DRAM according to Embodiment 3 in the order of the steps.

As illustrated in FIG. 20, subsequent to the washing after the CMP polishing, an insulating film 37 is deposited to a thickness of 100 nm. It is also possible to omit the insulating film 37. Then, a plug 44 to be connected with a bit line 38 and a lower electrode 45 of a storage capacitative element SN are formed, followed by the formation of the bit line 38, interconnections 39 and dummy interconnections 40. The dummy interconnections 40 are disposed under similar conditions to those for the dummy interconnections 11 of Embodiment 1. Then, a side wall 41b and a cap insulating film 41c are formed and a BPSG film is deposited thereon, followed by polishing of the BPSG film by the CMP method, whereby an insulating film 42 is formed. Incidentally, instead of the BPSG film, a PSG film or a silicon oxide film formed by the high-density plasma CVD method can be employed. Since the dummy interconnections 40 have been formed, the insulating film 42 is able to have a completely planarized surface and at the same time, it is possible to decrease the thickness of the BPSG film and reduce the CMP polishing amount. Then, washing is effected after the CMP polishing, followed by the deposition of an insulating film 43 by the plasma CVD method using TEOS or the like method. It is also possible to omit this insulating film 43.

Figure 21:
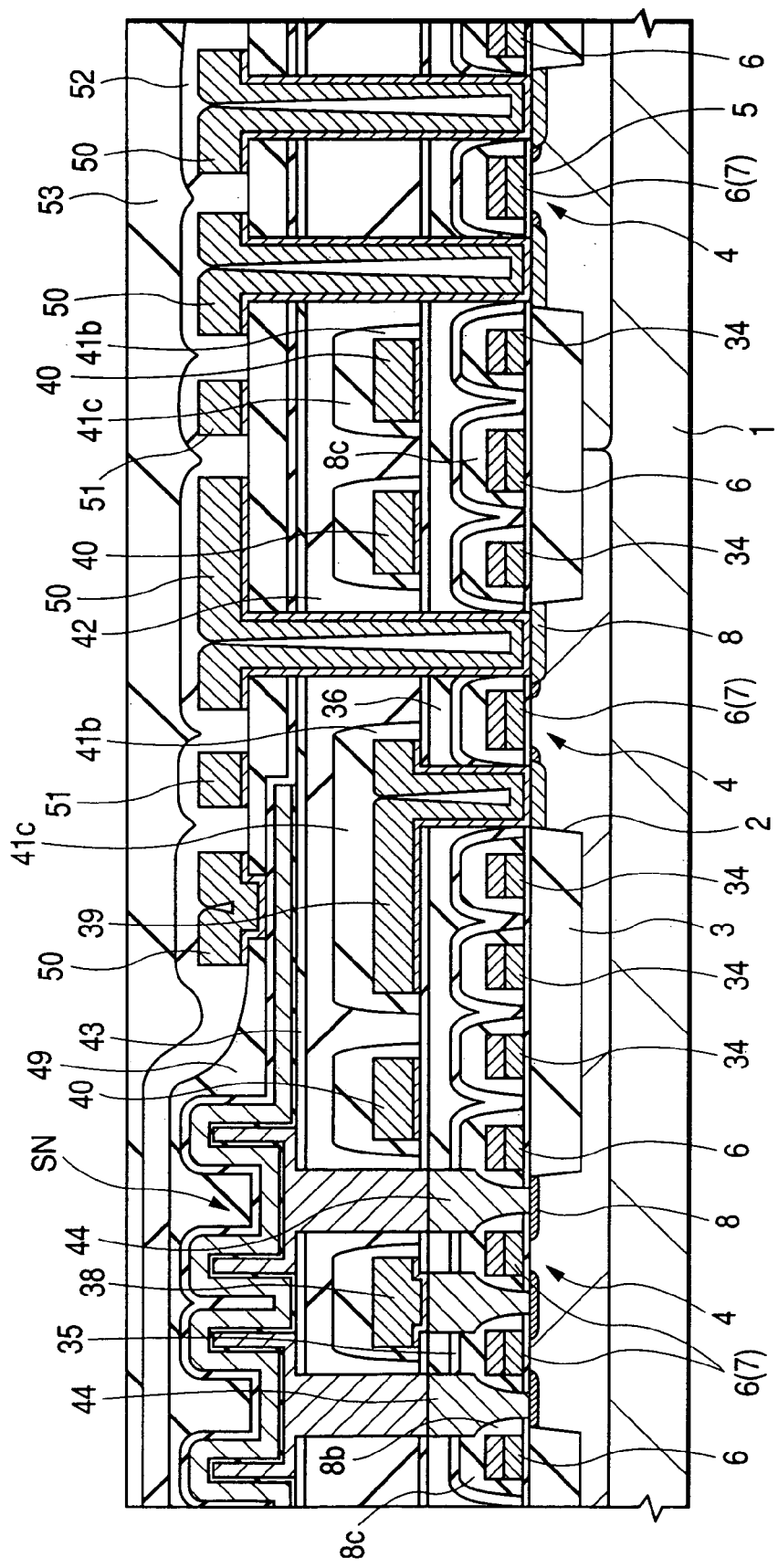
FIG. 21 is a cross-sectional view illustrating one example of the fabrication process of DRAM according to Embodiment 3 in the order of the steps.
Figure 22:
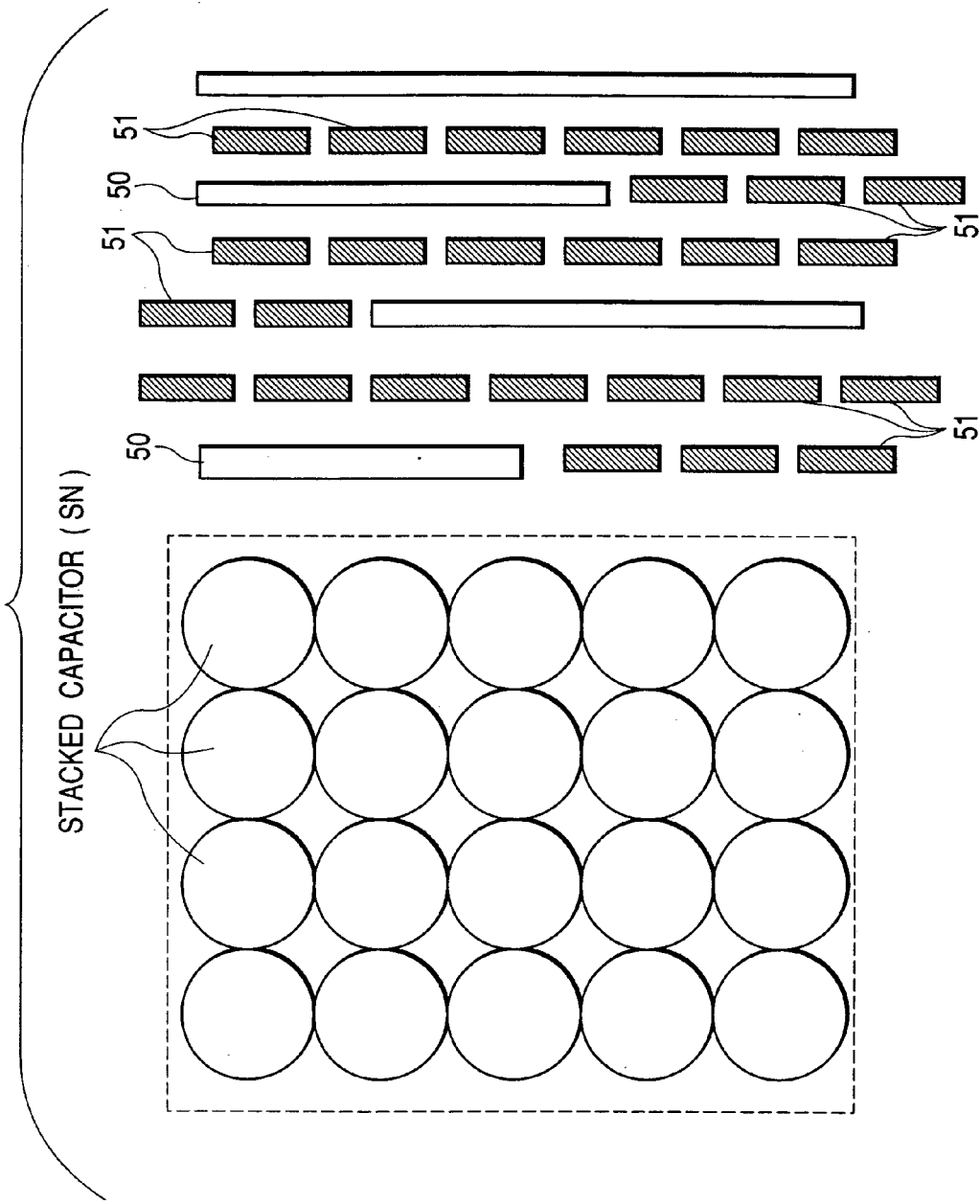
FIG. 22 is a cross-sectional view illustrating one example of a fabrication process of DRAM according to Embodiment 3 in the order of the steps.

Then, as illustrated in FIG. 21, a storage capacitive element SN is formed and a BPSG film is deposited thereon, followed by a baking treatment, whereby an insulating film 49 is formed. The insulating film 49 can be formed to a thickness of 500 nm. Subsequent to the opening of a contact hole, a tungsten film to be a first interconnection layer is formed by the CVD method, followed by the formation of an aluminum film by the sputtering method. Then, the resulting aluminum and tungsten films are patterned, whereby interconnections 50 and dummy interconnections 51 are formed. The dummy interconnections 51 are disposed under similar conditions to those for the dummy interconnections 11, and in addition, it is a condition that the dummy interconnections 51 are not disposed in a memory mat region where the storage capacitative device is disposed. FIG. 22 is a plan view illustrating the above conditions. A BPSG film is then deposited to form an insulating film 52. A TEOS silicon oxide film is deposited thereover, followed by polishing by the CMP method, whereby an insulating film 53 is formed. Instead of the BPSG film, a PSG film or a silicon oxide film formed by the high-density plasma CVD method can be employed. Here, the formation of the dummy interconnections 51 makes it possible to completely planarize the surface of the insulating film 53 and, at the same time, to decrease the thickness of the TEOS silicon oxide film and reduce the CMP polishing amount.

In a similar manner to Embodiment 1, second and third interconnection layers are then formed, whereby the DRAM of Embodiment 3 is almost completed. According to the fabrication process of Embodiment 3, the complete planarization of the insulating film of each of the layers can be attained and at the same time, the step load can be reduced.

Also in this Embodiment 3, dummy members can be disposed in the scribing area, but not at the peripheries of the bonding pad and marker, as illustrated in connection with Embodiments 1 or 2. In addition, it is possible to not dispose the dummy members at the periphery of the region in which a fuse is formed. Moreover, it is needless to say that the dummy gate interconnections 34 as described in Embodiment 3 can be disposed in the semiconductor integrated circuit device of Embodiments 1 or 2.

(Embodiment 4)

Figure 23:
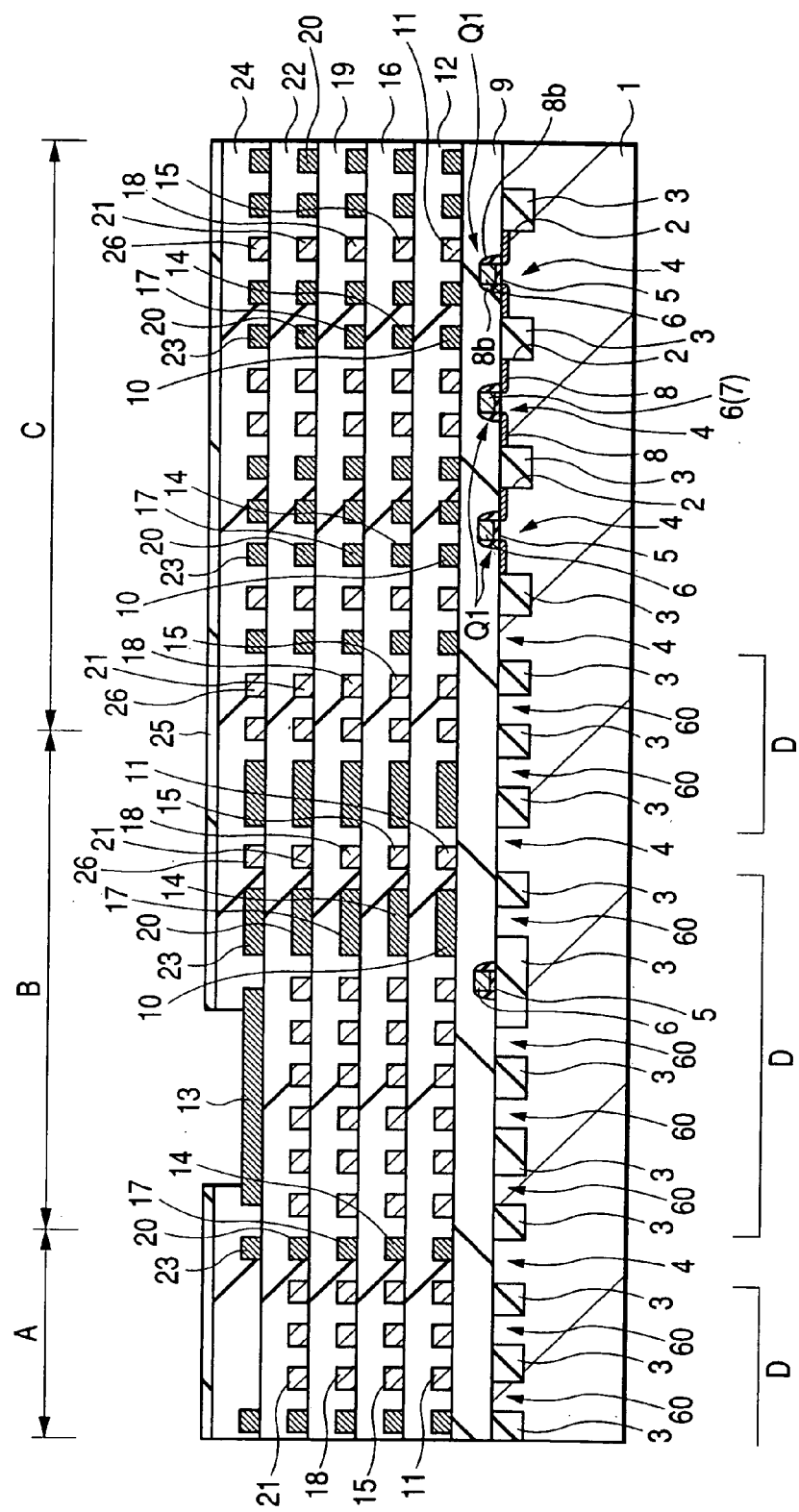
FIG. 23 is a cross-sectional view illustrating one example of a semiconductor integrated circuit device according to Embodiment 4.

FIG. 23 is a cross-sectional view illustrating one example of a semiconductor integrated circuit device according to Embodiment 4. The semiconductor integrated circuit device according to Embodiment 4 has dummy regions 60 formed in an element isolation region D,3 which defines an active region 4 of a semiconductor substrate 1. In other words, the dummy regions (dummy members) 60 are formed in the wide element isolation region D. Since elements and interconnections on the semiconductor substrate, except for the element isolation structure, are similar to those of Embodiment 1, a description thereof will be omitted. The dummy regions 60 may be formed in a scribing area, and they are disposed under similar conditions to those in Embodiment 1 concerning the dummy interconnections it. The dummy regions 60 have been formed as described above so that, upon the formation of the element isolation region D,3 by the CMP method, no dishing occurs in the element isolation region D,3 and therefore, the planarization of the surface of the semiconductor substrate 1 can be attained. In addition, by decreasing the size of the dummy regions 60 and optimizing the number of them, a rise in the parasitic capacitance attributable to the existence of the dummy regions 60 can be prevented, whereby the performance of the semiconductor integrated circuit device can be maintained.

Figure 24:
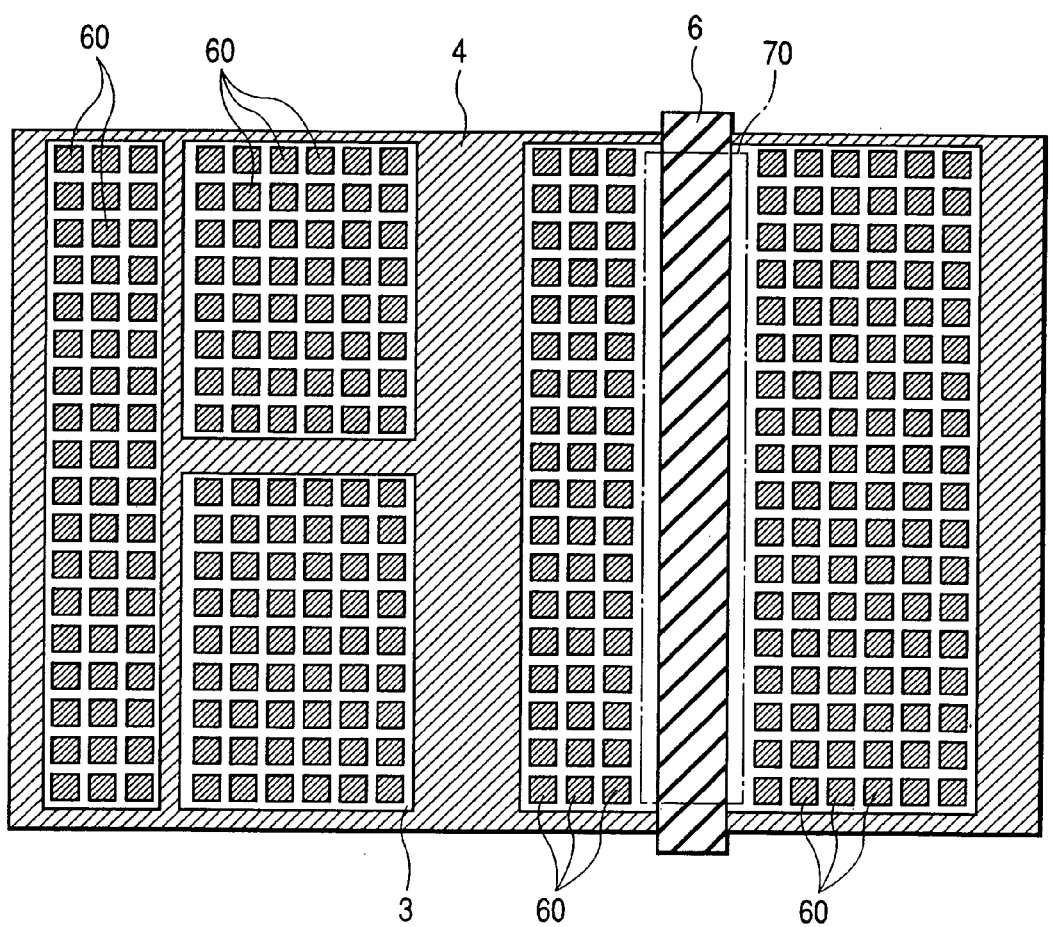
FIG. 24 is a plan view illustrating one example of the semiconductor integrated circuit device according to Embodiment 4.
Figure 31:
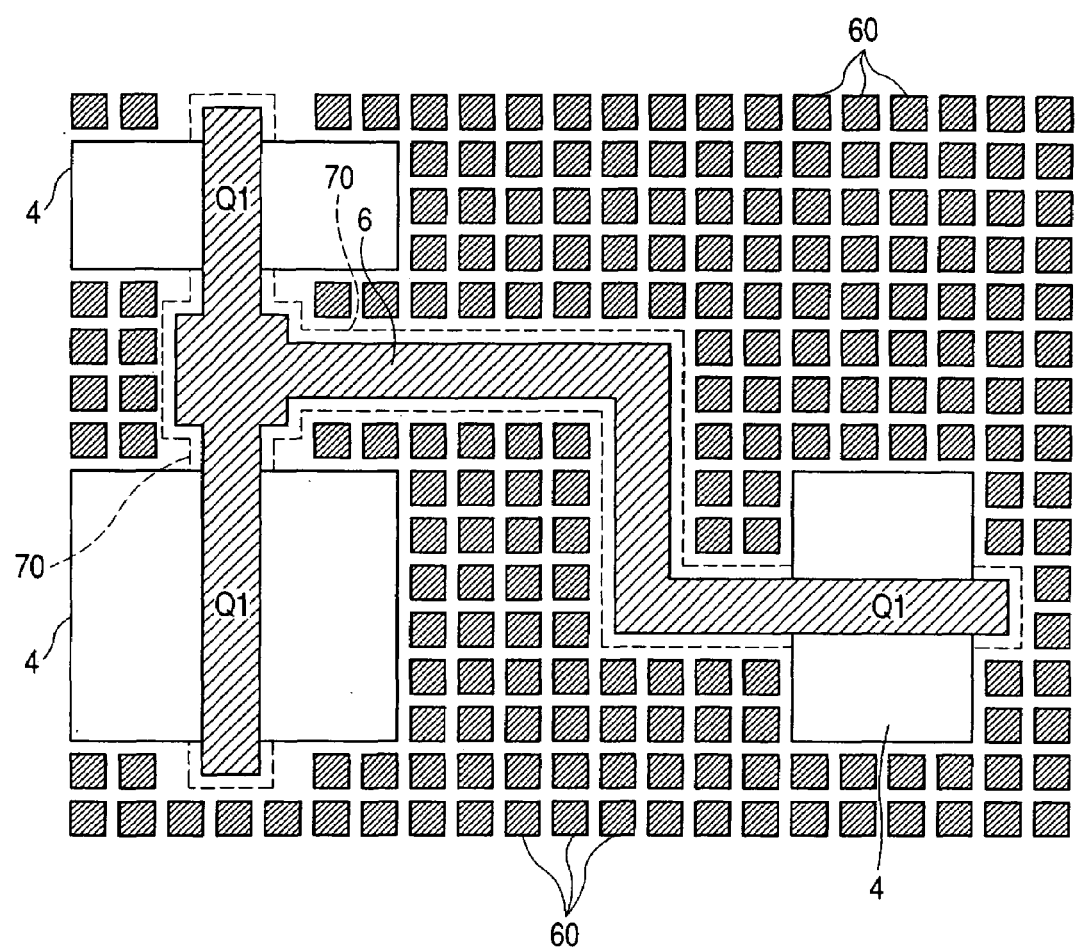
FIG. 31 is a plan view illustrating one example of the semiconductor integrated circuit device according to Embodiment 4 of the present invention.

Incidentally, in a region where gate interconnections 6 are to be formed, on the principal surface of the semiconductor substrate 1, it is not recommended to dispose the dummy regions 60. In other words, below the gate interconnections 6, a prohibited area 70 is provided in which no dummy region 60 is disposed. Such a state is illustrated in FIGS. 24 and 31. The dummy regions 60 have the same effects with the active region 4 of the semiconductor substrate 1. When the gate interconnection 6 is formed right above the dummy region 60, the gate interconnection 6 and the active region 4 become opposed to each other through the gate insulating film 5 and the parasitic capacitance of the gate interconnection 6 increases. When the dummy regions 60 are not disposed in the area where the gate interconnection 6 is to be formed, on the other hand, the parasitic capacitance of the gate interconnection 6 does not show an increase. As a result, such a constitution prevents the deterioration in the performance of the semiconductor integrated circuit device. In this Embodiment, the dummy regions 60 each has a quadrate shape having as width (a) and length (b), about 15 to 20 µm. This Embodiment is not limited to the use of a quadrate shape, but another shape, such as a square, also can be employed.

A description will next be made of the fabrication process of the semiconductor integrated circuit device according to Embodiment 4 with reference to FIGS. 25 to 28.

Figure 25:
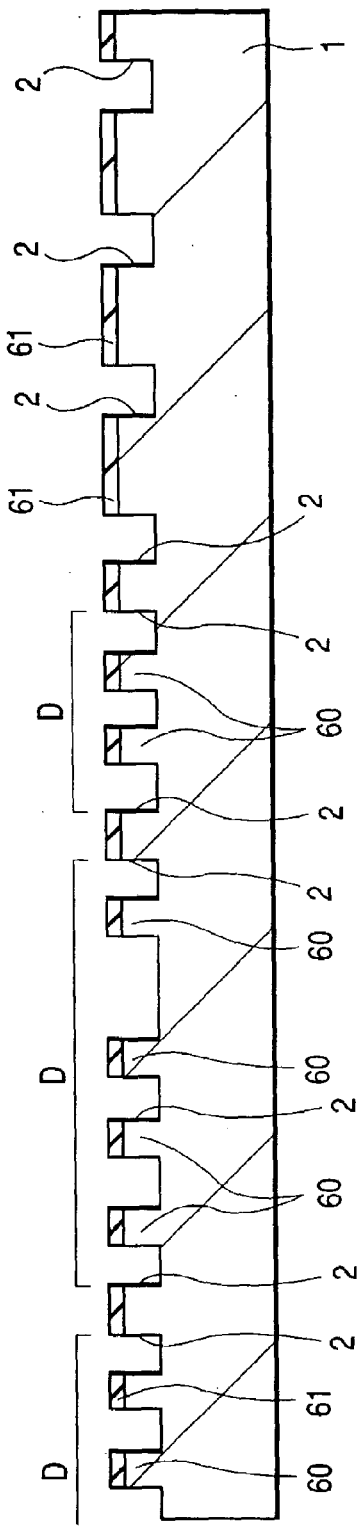
FIG. 25 is a cross-sectional view illustrating one example of the semiconductor integrated circuit device according to Embodiment 4 in the order of the steps.

As illustrated in FIG. 25, a silicon nitride film 61 is deposited on the principal surface of the semiconductor substrate 1, followed by the patterning of the silicon nitride film 61 and the semiconductor substrate 1 to form shallow trenches 2. The shallow trenches 2 include both those which will be element isolation regions D,3 and those which are dummy regions 60. In other words, the shallow trenches 2 are formed so that the dummy regions 60 are disposed in the element isolation region D,3 which defines the active region 4.

Figure 26:
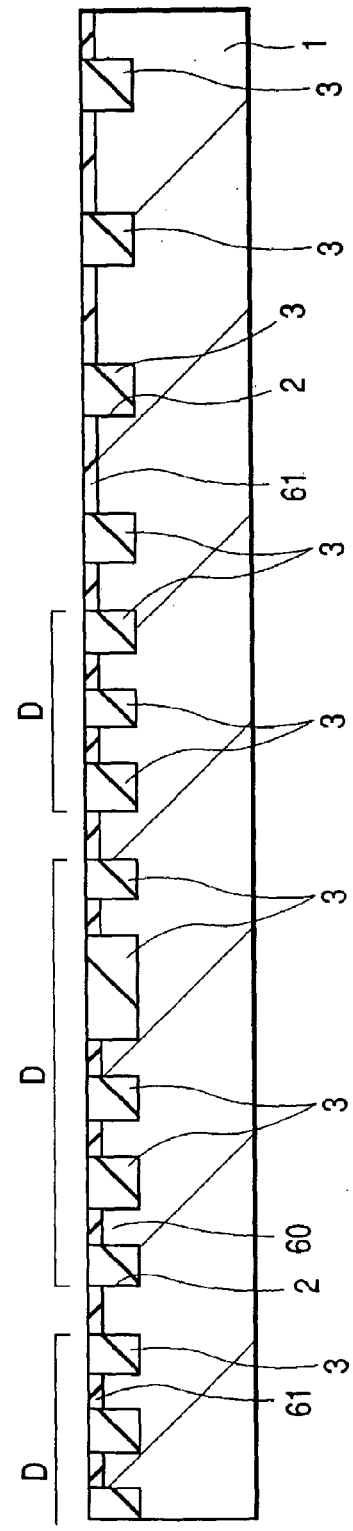
FIG. 26 is a cross-sectional view illustrating one example of the semiconductor integrated circuit device according to Embodiment 4 in the order of the steps.
Figure 29A:
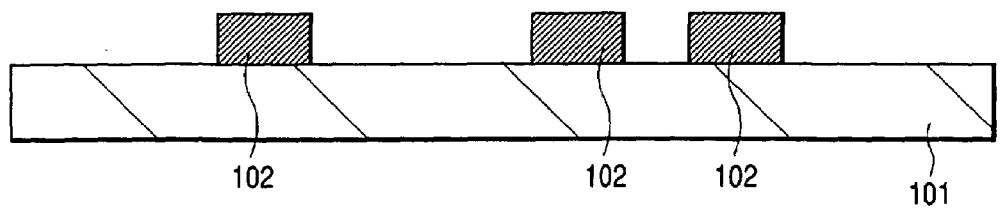
FIGS. 29(a) to 29(d) are each a cross-sectional view illustrating planarization technique by the CMP method investigated by the present inventors.
Figure 29B:
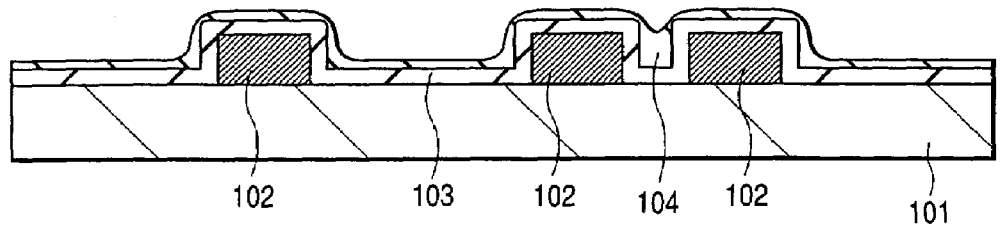
Figure 29C:
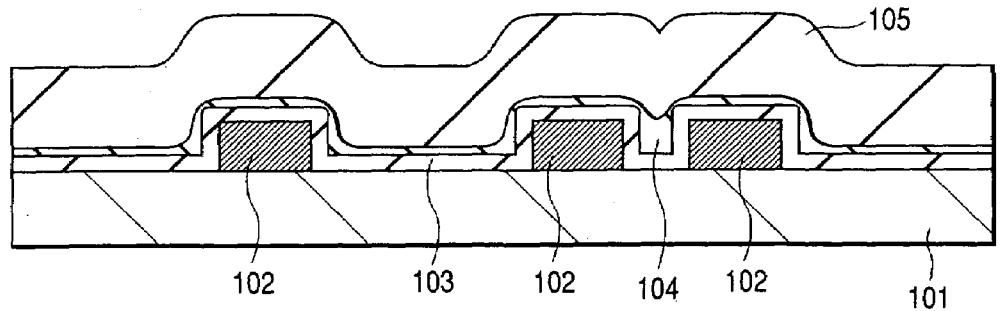
Figure 29D:
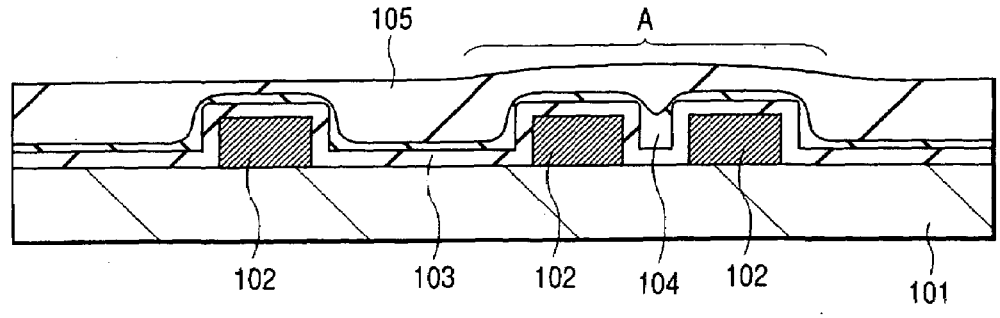

As illustrated in FIG. 26, a silicon oxide film is deposited, for example, by the CVD method. As a first polishing, the resulting film is polished by the CMP method and embedded in the shallow trench 2, whereby the element isolation region D,3 and dummy regions 60 are formed. For the first polishing, an alkaline slurry containing silicon oxide particles as an abrasive can be employed. In this case, it is necessary to form the silicon oxide film to a certain thickness because a ratio of the polishing rate of the silicon oxide film to that of the silicon nitride film becomes 3 to 4:1.

As illustrated in FIG. 27, secondary polishing is carried out to remove foreign matter and the damaged layer. For secondary polishing, either a soft pad or a chemical solution may be used. Instead, pure water may also be used. Then, both sides of the semiconductor substrate 1 are scrubbed and washed with hydrofluoric acid, followed by washing with ammonia and then hydrochloric acid. Then, the element isolation regions 3 and dummy regions 60 are etched back. The etchback can be effected either by dry etching or wet etching. By the etchback of the element isolation regions 3 and dummy regions 60 as described above, their heights can be made equal or lower than that of the active region, which makes it possible to carry out minute processing of a gate interconnection.

In the final step, the silicon nitride film 61 is removed, whereby the semiconductor substrate 1 as illustrated in FIG. 28 having the element isolation region D,3, which defines the active region 4, formed thereon is prepared. A description of the subsequent steps will be omitted because they are similar to those of embodiment 1.

Incidentally, the first polishing can be conducted using a slurry containing cerium oxide as an abrasive. In this case, the ratio of the polishing rate of the silicon oxide film to that of the silicon nitride film falls within a range of from 30–50 to 1, whereby the thickness of the silicon nitride film 61 can be suppressed to 50 nm or less. Since such a small thickness is negligible in the process design, the above-described etchback of the element isolation regions 3 and the dummy regions 60 can be omitted, leading to a simplification of the process.

The present invention made by the present inventors has been described above specifically based on some embodiments. It should however be borne in mind that the present invention is not limited to the specific embodiments. It is needless to say that various changes and modifications can be made so long as they do not depart from the essence of the invention.

For example, in the above Embodiments 1 to 4, the CMP step serves as a step for polishing an insulating film. The present invention makes it possible to secure flatness to some extent prior to the CMP polishing so that the CMP polishing can be employed as a finishing step. In this case, not only the CMP method, but also dry-belt polishing or lapping method, can be adopted as the finishing step.

Figure 32:
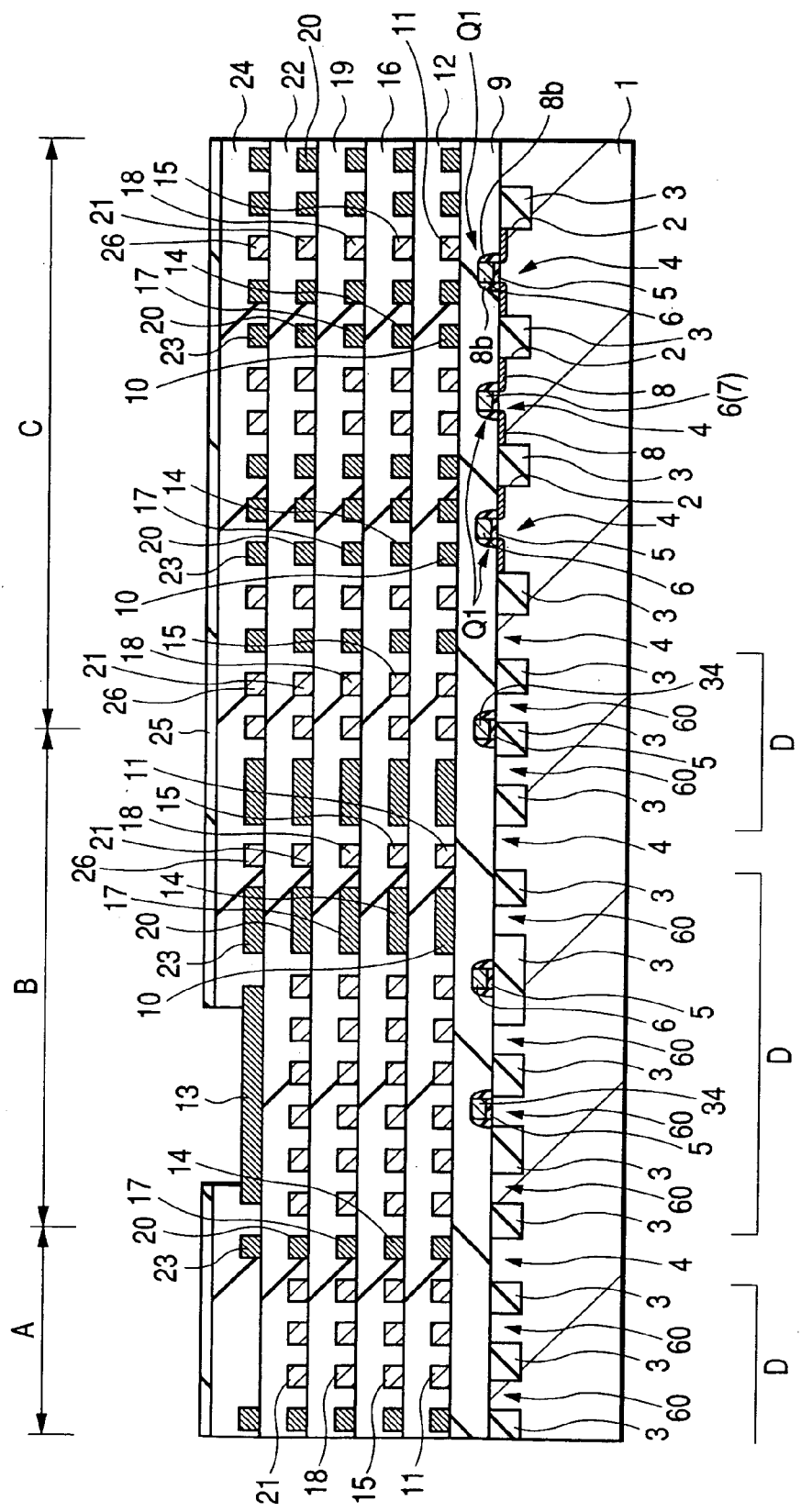
FIG. 32 is a cross-sectional view illustrating one example of a semiconductor integrated circuit device according to Embodiment 5 of the present invention.
Figure 33:
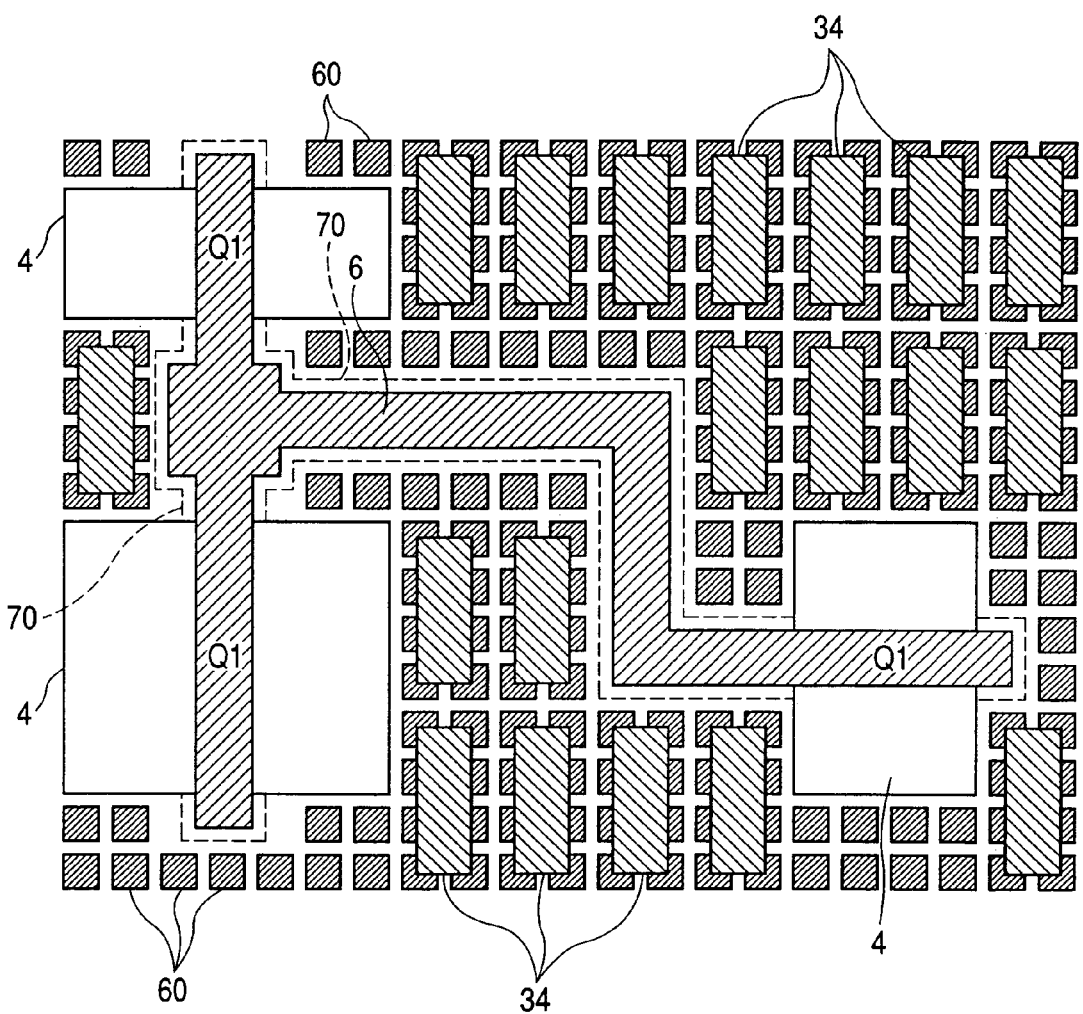
FIG. 33 is a fragmentary plan view of the semiconductor integrated circuit device of FIG. 32.

As illustrated in FIG. 32, the dummy gate interconnections 34 as shown in Embodiment 3 may be disposed in Embodiment 4. FIG. 33 is a fragmentary plan view of FIG. 32. Dummy gate interconnections 34 are constituted so that they extend over element isolation regions D,3 and dummy regions 60. Each of the dummy gate interconnections 34 is formed on the dummy region 60 thorough a gate insulating film 5 under the electrically floating state.

By ion implantation using as a mask a resist film covering the element isolation region D,3 upon the formation of a semiconductor region 8, which is to be a source and drain region for the MISFETQ1, impurities are not introduced into each of the dummy regions 60 and a semiconductor region 8 is not formed in this region.

Figure 34:
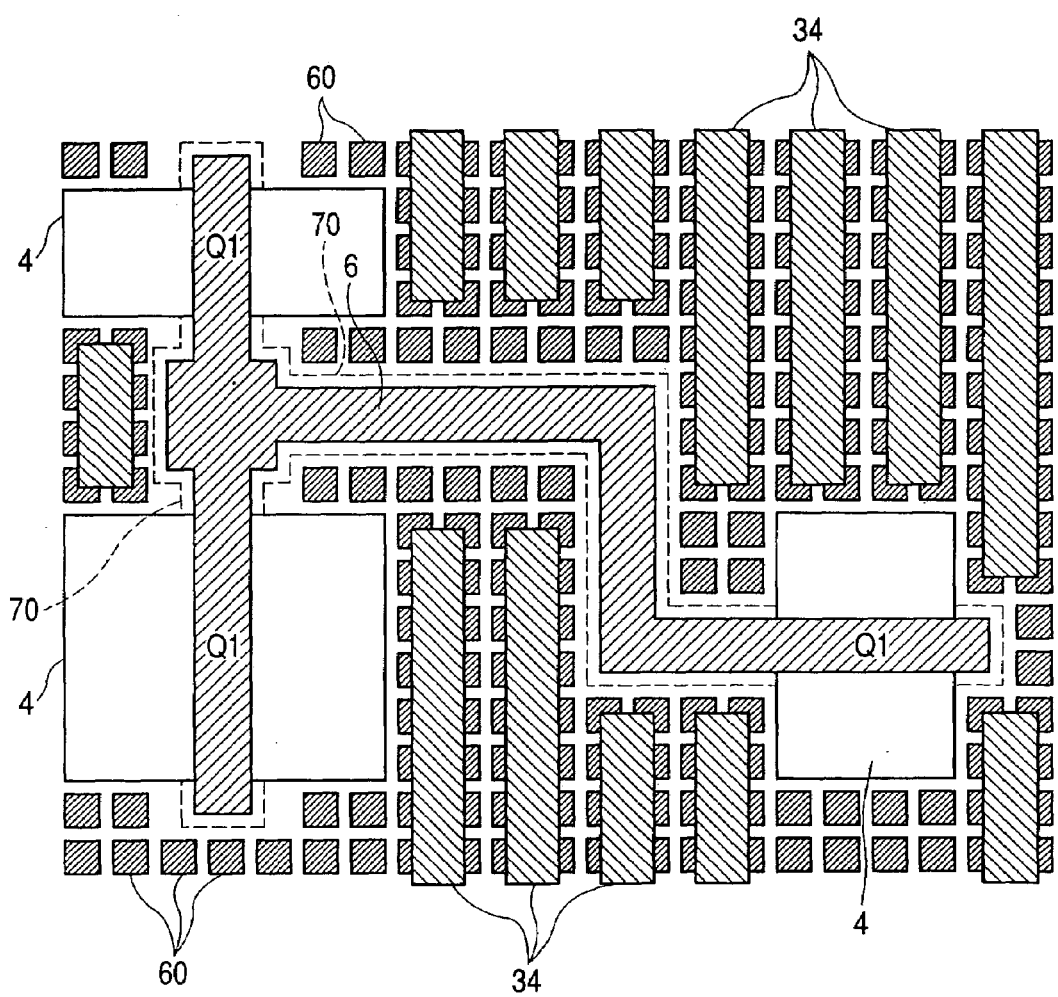
FIG. 34 is a fragmentary plan view of the semiconductor integrated circuit device of FIG. 32

As illustrated in FIG. 34, the dummy gate interconnections 34 may be formed to be slender over the interconnection as illustrated in FIG. 34, which makes it possible to improve the flatness of the surface of the insulting film.

The dummy gate interconnections 34 may be formed to extend only over the element isolation region 3 and not to extend over the dummy regions 60, so that the capacitance between the substrate 1 and the dummy gate interconnections 34 is decreased. Incidentally, it is needless to say that the dummy regions 60 as is shown in this Embodiment can be employed in Embodiment 3.

The advantages available by the typical embodiments, among those disclosed herein, will hereinafter be described simply.

The surface of a member after polishing by the CMP method can be planarized completely.

The process margin in the photolithography step, etching step and the like can be heightened, a demand for minute processing and integration heightening can be satisfied, and the reliability and yield of the semiconductor integrated circuit device can be improved.

The process can be started easily.

The amount of polishing of the member to be polished by the CMP method can be reduced, which decreases the load and time of the step, leading to an improvement in the cost competitive advantage.

A method of designing a member pattern permitting the complete planarization by the CMP method can be provided.

An increase in the parasitic capacitance of interconnections or the like, which is derived from the measures to actualize the complete planarization, can be suppressed, whereby the performance of the semiconductor integrated circuit device can be maintained.

What is claimed is:

1. A semiconductor integrated circuit device comprising:
   trenches formed in a semiconductor substrate and defining active regions and dummy regions not functioning as an element;
   element isolation insulating films filled in said trenches;
   dummy interconnections formed over said substrate not functioning as an element,
   wherein said dummy regions are regularly arranged at a scribing area and at a pad region, respectively,
   wherein said dummy interconnections are regularly arranged at said scribing area and at said pad region, respectively.

2. A semiconductor integrated circuit device according to claim 1, wherein said dummy interconnections are formed by the same level layer as a gate electrode of a MISFET,
   wherein said active region serves as a part of said MISFET such that a source region and a drain region of said MISFET are formed in said action region,
   wherein said dummy region does not serve as a part of a MISFET.

3. A semiconductor integrated circuit device according to claim 1, wherein said dummy interconnection is formed by the same level layer as interconnections of a memory device.

4. A semiconductor integrated circuit device according to claim 1, wherein said dummy interconnection is formed by the same level layer as interconnections functioning as bit lines of a dynamic random access memory.

5. A semiconductor integrated circuit device comprising:
   trenches formed in a semiconductor substrate and defining an active region and dummy regions not functioning as an element such that an MISFET (Qt) includes a source region and a drain region formed in said active region;
   element isolation insulating films filled in said trenches;
   an interconnection formed over said substrate and electrically connecting one of said source region and said drain region; and
   dummy interconnections formed over said substrate and not functioning as an element,
   wherein said dummy interconnections are formed by the same level layer as interconnections,
   wherein said dummy regions are regularly arranged at a scribing area and at a pad region, respectively, wherein said dummy interconnections are regularly arranged at said scribing area and at said pad region, respectively.

6. A semiconductor integrated circuit device according to claim 5, wherein said MISFET comprises an MISFET of a memory device.

7. A semiconductor integrated circuit device according to claim 5, wherein said MISFET comprises an MISFET of a memory cell of a dynamic random access memory,
wherein said interconnection is a bit line of said dynamic random access memory.

8. A semiconductor integrated circuit device according to claim 5, wherein a capacitor element (SN) of said memory cell is formed over said interconnection.

9. A semiconductor integrated circuit device comprising:
trenches formed in a semiconductor substrate and defining active regions and dummy regions not functioning as an element;
element isolation insulating films filled in said trenches;
first dummy interconnections formed over said substrate and not functioning as an element;
a first interlayer insulating film formed over said first dummy interconnections; and
second dummy interconnections formed over said first interlayer insulating film and not functioning as an element,
wherein said dummy regions, said first dummy interconnections and said second dummy interconnections are regularly arranged at a scribing area, respectively.

10. A semiconductor integrated circuit device according to claim 9, wherein said first dummy interconnections are formed by the same level layer as a gate electrode of a MISFET,
wherein said active region serves as a part of said MISFET such that a source region and a drain region of said MISFET are formed in said active region,
wherein said dummy region does not serve as a part of a MISFET,
wherein said second dummy interconnection is formed by the same level layer as interconnections of a memory device.

11. A semiconductor integrated circuit device according to claim 9, wherein said dummy interconnections are formed by the same level layer as a gate electrode of a MISFET,
wherein said active region serves as a part of said MISFET such that a source region and a drain region of said MISFET are formed in said active region,
wherein said second dummy interconnection is formed by the same level layer as interconnections functioning as bit lines of a dynamic random access memory.

12. A semiconductor integrated circuit device according to claim 9, wherein said first dummy interconnections are formed over said dummy regions,
wherein said second dummy interconnections are formed over said first dummy interconnections.

13. A semiconductor integrated circuit device comprising:
trenches formed in a semiconductor substrate and defining an active region and dummy regions not functioning as an element such that an MISFET (Qt) includes a source region and a drain region formed in said active region;
element isolation insulating films filled in said trenches;
first dummy interconnections formed over said substrate and not functioning as an element;
a first interlayer insulating film formed over said first dummy interconnections;
an interconnection formed over said first interlayer insulating film and electrically connecting one of said source region and said drain region; and
second dummy interconnections formed over said first interlayer insulating film not functioning as an element,
wherein said second dummy interconnections are formed by the same level layer as interconnections,
wherein said first dummy interconnections are formed by the same level layer as a gate electrode of a MISFET,
wherein said dummy regions, said first dummy interconnections and said second dummy interconnections are regularly arranged at a scribing area, respectively.

14. A semiconductor integrated circuit device according to claim 13, wherein said MISFET comprises an MISFET of a memory device.

15. A semiconductor integrated circuit device according to claim 13, wherein said MISFET comprises an MISFET of a memory cell of a dynamic random access memory,
wherein said interconnection is a bit line of said dynamic random access memory.

16. A semiconductor integrated circuit device according to claim 13, wherein a capacitor element (SN) of said memory cell is formed over said interconnection.

17. A semiconductor integrated circuit device according to claim 13, wherein said first dummy interconnections are formed over said dummy regions,
wherein said second dummy interconnections are formed over said first dummy interconnections.

18. A semiconductor integrated circuit device comprising:
a first trench formed in a semiconductor substrate, said first trench surrounding active regions;
a second trench formed in said semiconductor substrate, said second trench surrounding dummy regions not function as an element;
element isolation insulating films filled in said first trench and said second trench;
first dummy interconnections formed over said substrate and not functioning as an element;
a first interlayer insulating film formed over said first dummy interconnections; and
second dummy interconnections formed over said first interlayer insulating film and not functioning as an element,
wherein said dummy regions, said first dummy interconnections and said second dummy interconnections are regularly arranged at a scribing area, respectively.

19. A semiconductor integrated circuit device according to claim 18, wherein said first dummy interconnections are formed by the same level layer as a gate electrode of a MISFET,
wherein said active region serves as a part of said MISFET such that a source region and a drain region of said MISFET are formed in said active region,
wherein said dummy region does not serve as a part of a MISFET,
wherein said second dummy interconnection is formed by the same level layer as interconnections of a memory device.

20. A semiconductor integrated circuit device according to claim 18, wherein said first dummy interconnections are formed by the same level layer as a gate electrode of a MISFET,
wherein said active region serves as a part of said MISFET such that a source region and a drain region of said MISFET are formed in said active region, wherein said second dummy interconnection is formed by the same level layer as interconnections functioning as bit lines of a dynamic random access memory.

21. A semiconductor integrated circuit device according to claim 18, wherein said first dummy interconnections are formed over said dummy regions, wherein said second dummy interconnections are formed over said first dummy interconnections.

22. A semiconductor integrated circuit device comprising:

a first trench formed in a semiconductor substrate, said first trench surrounding active regions;

a second trench formed in said semiconductor substrate, said second trench surrounding dummy regions not function as an element;

element isolation insulating films filled in said first trench and said second trench;

first dummy interconnections formed over said substrate and not functioning as an element;

a first interlayer insulating film formed over said first dummy interconnections;

an interconnection formed over said first interlayer insulating film and electrically connecting one of said source region and said drain region; and second dummy interconnections formed over said first interlayer insulating film and not functioning as an element, wherein said second dummy interconnections are formed by the same level layer as interconnections, wherein said first dummy interconnections are formed by the same level layer as a gate electrode of a MISFET, wherein said dummy regions, said first dummy interconnections and said second dummy interconnections are regularly arranged at a scribing area, respectively.

23. A semiconductor integrated circuit device according to claim 22, wherein said MISFET comprises an MISFET of a memory device.

24. A semiconductor integrated circuit device according to claim 23, wherein said MISFET comprises an MISFET of a memory cell of a dynamic random access memory, wherein said interconnection is a bit line of said dynamic random access memory.

25. A semiconductor integrated circuit device according to claim 23, wherein a capacitor element (SN) of said memory cell is formed over said interconnection.

26. A semiconductor integrated circuit device according to claim 23, wherein said first dummy interconnections are formed over said dummy regions, wherein said second dummy interconnections are formed over said dummy interconnections.

27. A semiconductor integrated circuit device comprising:

trenches formed in a semiconductor substrate and defining active regions and dummy regions not functioning as an element;

element isolation insulating films filled in said trenches;

first dummy interconnections formed over said substrate and not functioning as an element;

a first interlayer insulating film formed over said first dummy interconnections; and second dummy interconnections formed over said first interlayer insulating film and not functioning as an element, wherein said dummy regions, said first dummy interconnections and said second dummy interconnections are arranged at a scribing area.

28. A semiconductor integrated circuit device according to claim 27, wherein said first dummy interconnections are formed by the same level layer as a gate electrode of a MISFET, wherein said active region serves as a part of said MISFET such that a source region and a drain region of said MISFET are formed in said active region, wherein said dummy region does not serve as a part of a MISFET, wherein said second dummy interconnection is formed by the same level layer as interconnections of a memory device.

29. A semiconductor integrated circuit device according to claim 27, wherein said first dummy interconnections are formed by the same level layer as a gate electrode of a MISFET, wherein said active region serves as a part of said MISFET such that a source region and a drain region of said MISFET are formed in said active region, wherein said second dummy interconnection is formed by the same level layer as interconnections functioning as bit lines of a dynamic random access memory.

30. A semiconductor integrated circuit device according to claim 27, wherein said first dummy interconnections are formed over said dummy regions, wherein said second dummy interconnections are formed over said first dummy interconnections.

31. A semiconductor integrated circuit device comprising:

trenches formed in a semiconductor substrate and defining an active region and dummy regions not functioning as an element such that an MISFET (Qt) includes a source region and a drain region formed in said active region;

element isolation insulating films filled in said trenches;

first dummy interconnections formed over said substrate and not functioning as an element;

a first interlayer insulating film formed over said first dummy interconnections;

an interconnection formed over said first interlayer insulating film and electrically connecting one of said source region and said drain region; and second dummy interconnections formed over said first interlayer insulating film and not functioning as an element, wherein said second dummy interconnections are formed by the same level layer as interconnections, wherein said first dummy interconnections are formed by the same level layer as a gate electrode of a MISFET, wherein said dummy regions, said first dummy interconnections and said second dummy interconnections are arranged at a scribing area.

32. A semiconductor integrated circuit device according to claim 31, wherein said MISFET comprises an MISFET of a memory device.

33. A semiconductor integrated circuit device according to claim 31, wherein said MISFET comprises an MISFET of a memory cell of a dynamic random access memory, wherein said interconnection is a bit line of said dynamic random access memory.

34. A semiconductor integrated circuit device according to claim 31, wherein a capacitor element (SN) of said memory cell is formed over said interconnection.

35. A semiconductor integrated circuit device according to claim 31, wherein said first dummy interconnections are formed over said dummy regions, wherein said second dummy interconnections are formed over said first dummy interconnections.

36. A semiconductor integrated circuit device comprising:
a first trench formed in a semiconductor substrate, said first trench surrounding active regions;
a second trench formed in said semiconductor substrate, said second trench surrounding dummy regions not function as an element;
element isolation insulating films filled in said first trench and said second trench;
first dummy interconnections formed over said substrate and not functioning as an element;
a first interlayer insulating film formed over said first dummy interconnections; and
second dummy interconnections formed over said first interlayer insulating film and not functioning as an element,
wherein said dummy regions, said first dummy interconnections and said second dummy interconnections are arranged at a scribing area.

37. A semiconductor integrated circuit device according to claim 36, wherein said first dummy interconnections are formed by the same level layer as a gate electrode of a MISFET,
wherein said active region serves as a part of said MISFET such that a source region and a drain region of said MISFET are formed in said active region,
wherein said dummy region does not serve as a part of a MISFET,
wherein said second dummy interconnection is formed by the same level layer as interconnections of a memory device.

38. A semiconductor integrated circuit device according to claim 36, wherein said first dummy interconnections are formed by the same level layer as a gate electrode of a MISFET,
wherein said active region serves as a part of said MISFET such that a source region and a drain region of said MISFET are formed in said active region,
wherein said second dummy interconnection is formed by the same level layer as interconnections functioning as bit lines of a dynamic random access memory.

39. A semiconductor integrated circuit device according to claim 36, wherein said first dummy interconnections are formed over said dummy regions,
wherein said second dummy interconnections are formed over said first dummy interconnections.

40. A semiconductor integrated circuit device comprising:
a first trench formed in a semiconductor substrate, said first trench surrounding active regions;
a second trench formed in said semiconductor substrate, said second trench surrounding dummy regions not function as an element;
element isolation insulating films filled in said first trench and said second trench;
first dummy interconnections formed over said substrate and not functioning as an element;
a first interlayer insulating film formed over said first dummy interconnections;
an interconnection formed over said first interlayer insulating film and electrically connecting one of said source region and said drain region; and
second dummy interconnections formed over said first interlayer insulating film and not functioning as an element,
wherein said second dummy interconnections are formed by the same level layer as interconnections,
wherein said first dummy interconnections are formed by the same level layer as a gate electrode of a MISFET,
wherein said dummy regions, said first dummy interconnections and said second dummy interconnections are arranged at a scribing area.

41. A semiconductor integrated circuit device according to claim 40, wherein said MISFET comprises an MISFET of a memory device.

42. A semiconductor integrated circuit device according to claim 40, wherein said MISFET comprises an MISFET of a memory cell of a dynamic random access memory,
wherein said interconnection is a bit line of said dynamic random access memory.

43. A semiconductor integrated circuit device according to claim 40, wherein a capacitor element (SN) of said memory cell is formed over said interconnection.

44. A semiconductor integrated circuit device according to claim 40, wherein said first dummy interconnections are formed over said dummy regions,
wherein said second dummy interconnections are formed over said first dummy interconnections.

* * * * *

UNITED STATES PATENT AND TRADEMARK OFFICE
CERTIFICATE OF CORRECTION

| | |
|---|---|
| PATENT NO. | : 7,199,432 B2 |
| APPLICATION NO. | : 10/926142 |
| DATED | : April 3, 2007 |
| INVENTOR(S) | : Koubuchi et al. |

It is certified that error appears in the above-identified patent and that said Letters Patent is hereby corrected as shown below:

Title Pg, Item (30) should read as follows:

-- (30) Foreign Application Priority Data
March 31, 1997 (JP) 9-81013
Feb. 16, 1998 (JP)10-33388 --

Signed and Sealed this
Fifth Day of April, 2011

David J. Kappos
*Director of the United States Patent and Trademark Office*